(12) United States Patent
Sato et al.

(10) Patent No.: US 10,283,649 B2
(45) Date of Patent: May 7, 2019

(54) SCHOTTKY BARRIER DIODE AND ELECTRONIC APPARATUS

(71) Applicant: FUJITSU LIMITED, Kawasaki-shi, Kanagawa (JP)

(72) Inventors: Shintaro Sato, Atsugi (JP); Hideyuki Jippo, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/600,151

(22) Filed: May 19, 2017

(65) Prior Publication Data

US 2017/0345950 A1 Nov. 30, 2017

(30) Foreign Application Priority Data

May 31, 2016 (JP) .................................. 2016-108177

(51) Int. Cl.
*B82Y 10/00* (2011.01)
*B82Y 40/00* (2011.01)
(Continued)

(52) U.S. Cl.
CPC ............ *H01L 29/872* (2013.01); *B82Y 10/00* (2013.01); *B82Y 40/00* (2013.01); *H01L 29/068* (2013.01);
(Continued)

(58) Field of Classification Search
CPC ............. H01L 29/1606; H01L 21/8213; H01L 21/8221; H01L 21/823807;
(Continued)

(56) References Cited

U.S. PATENT DOCUMENTS 9,786,797 B2 * 10/2017 Harada .................. H01L 29/88
2010/0102292 A1 * 4/2010 Hiura ..................... B82Y 10/00
257/9
(Continued)

FOREIGN PATENT DOCUMENTS

JP 2011-503833 1/2011
JP 2011-198938 10/2011
(Continued)

OTHER PUBLICATIONS

Harish M. Manohara et al., "Carbon Nanotube Schottky Diodes Using Ti-Schottky and Pt-Ohmic Contacts for High Frequency Applications", Nano Letters vol. 5, No. 7, pp. 1469-1474 (6 pages), May 27, 2005.
(Continued)

*Primary Examiner* — Edward Chin
(74) *Attorney, Agent, or Firm* — Fujitsu Patent Center

(57) ABSTRACT

A Schottky barrier diode includes a graphene nanoribbon, a first electrode connected to one end of the graphene nanoribbon, and a second electrode connected to the other end of the graphene nanoribbon. The graphene nanoribbon includes a first part and a second part which are connected in the length direction of the graphene nanoribbon and which differ in electronic state. For example, edges of the first part in a length direction of the graphene nanoribbon are terminated with a first modifying group and edges of the second part in the length direction of the graphene nanoribbon are terminated with a second modifying group.

16 Claims, 24 Drawing Sheets

(51) Int. Cl.
*H01L 29/06* (2006.01)
*H01L 29/16* (2006.01)
*H01L 29/66* (2006.01)
*H01L 29/872* (2006.01)

(52) U.S. Cl.
CPC ...... *H01L 29/0673* (2013.01); *H01L 29/1606* (2013.01); *H01L 29/6603* (2013.01)

(58) Field of Classification Search
CPC ......... H01L 21/823828; H01L 27/0207; H01L 27/0688; H01L 27/088; H01L 27/092; H01L 27/11; H01L 27/1104; H01L 29/0665; H01L 29/0673
USPC ........ 257/E21.042, E29.086, 26, 9; 438/312, 438/478
See application file for complete search history.

(56) References Cited

U.S. PATENT DOCUMENTS

| | | |
|---|---|---|
| 2010/0132773 A1 | 6/2010 | Lagally et al. |
| 2011/0227044 A1 | 9/2011 | Kawanaka et al. |
| 2013/0099205 A1 | 4/2013 | Liu et al. |
| 2016/0027928 A1 | 1/2016 | Sato |
| 2016/0087087 A1* | 3/2016 | Kub .................. H01L 29/66242 257/26 |
| 2017/0062627 A1* | 3/2017 | Harada .................. H01L 29/88 |
| 2017/0125557 A1* | 5/2017 | Kub .................. H01L 29/66242 |

FOREIGN PATENT DOCUMENTS

| | | |
|---|---|---|
| JP | 2014-212308 | 11/2014 |
| JP | 2014-532982 | 12/2014 |
| WO | 2013/059708 | 4/2013 |

OTHER PUBLICATIONS

Hiroyuki Sugimura et al., "Organosilane self-assembled monolayers formed at the vapour/solid interface", Surface and Interface Analysis vol. 34, Issue 1, pp. 550-554 (5 pages), Aug. 2002.

Mikhail Patrashin et al., "GaAsSb/InAlAs/InGaAs Tunnel Diodes for Millimeter Wave Detection in 220-330-GHz Band", IEEE Transactions on Electron Devices, vol. 62, Issue 3, pp. 1068-1071 (4 pages), Mar. 2015.

Young-Woo Son et al., "Energy Gaps in Graphene Nanoribbons", Physical Review Letters vol. 97, Issue 21, pp. 216803-1 to 216803-4 (4 pages), Nov. 24, 2006.

* cited by examiner

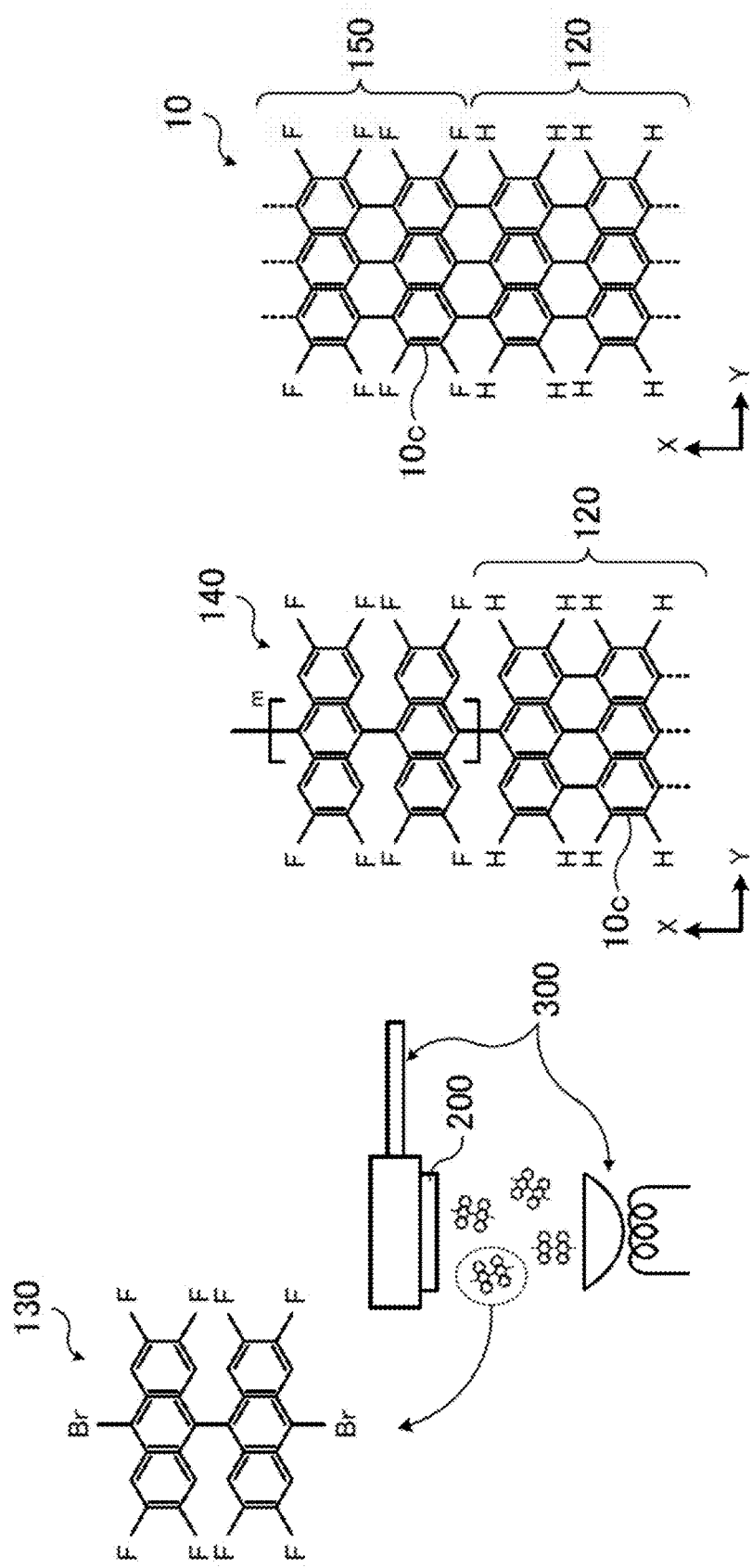

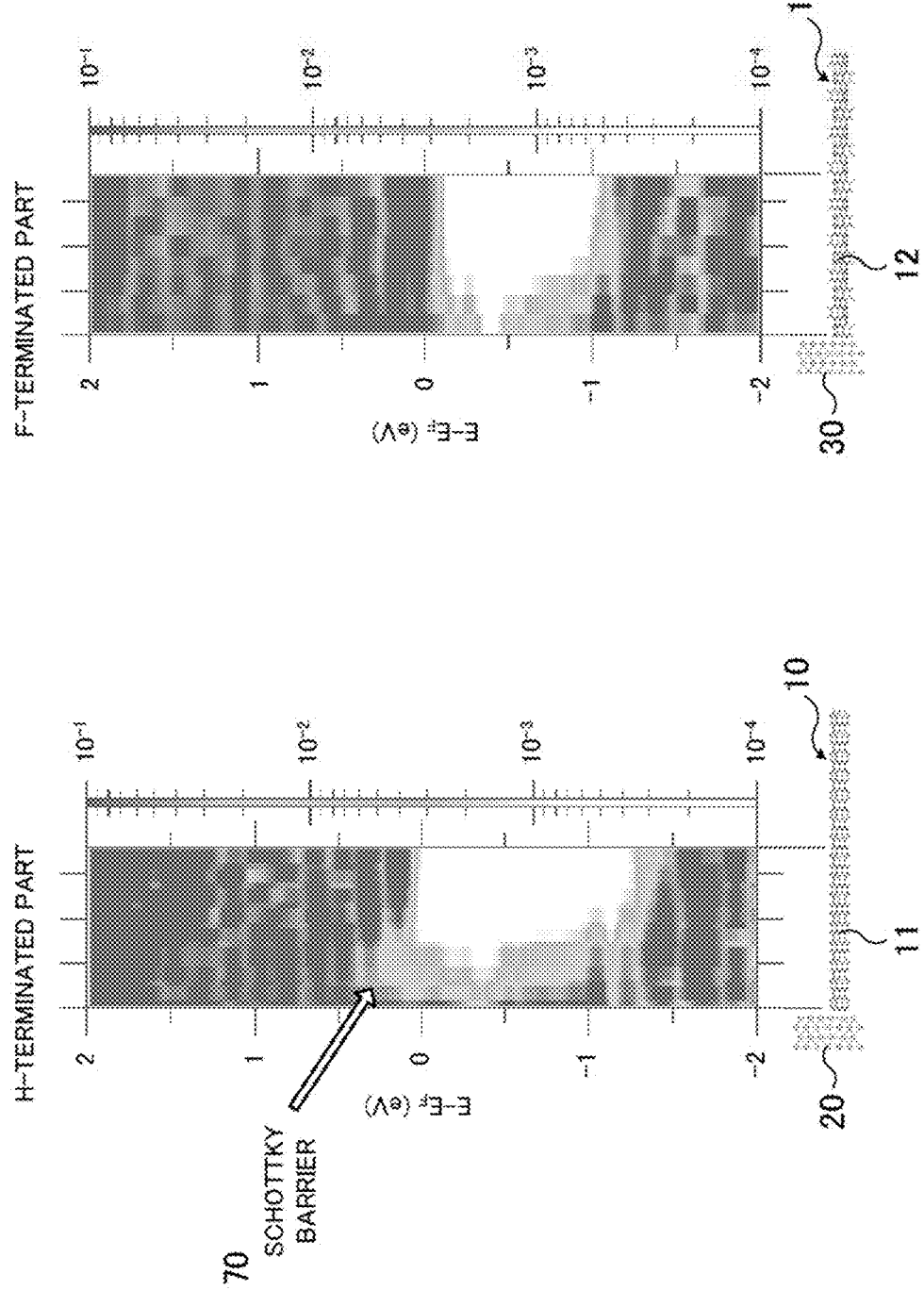

SCHOTTKY BARRIER DIODE AND ELECTRONIC APPARATUS

CROSS-REFERENCE TO RELATED APPLICATION

This application is based upon and claims the benefit of priority of the prior Japanese Patent Application No. 2016-108177, filed on May 31, 2016, the entire contents of which are incorporated herein by reference.

FIELD

The embodiments discussed herein are related to a Schottky barrier diode and an electronic apparatus.

BACKGROUND

Devices, such as light-emitting diodes, are known as devices in which a nanocarbon material is used. In these devices a pair of lead wires are connected to both end portions of a graphene nanoribbon or both end portions of each of a plurality of stacks including groups of graphene nanoribbons which differ in band gap. It is known that the band gap of a graphene nanoribbon changes according to its width, its thickness, its edge state, doping, or the like.

Furthermore, a Schottky barrier diode in which a pair of metals, such as titanium (Ti) and platinum (Pt), are connected to both end portions of a single-layer carbon nanotube is known.

International Publication Pamphlet No. WO2013/059708A2

Harish M. Manohara et al., "Carbon Nanotube Schottky Diodes Using Ti-Schottky and Pt-Ohmic Contacts for High Frequency Applications," Nano Letters, Vol. 5, No. 7, pp. 1469-1474, May 27, 2005

Unlike pn junction diodes in which majority carriers and minority carriers exist, only majority carriers exist in Schottky barrier diodes in which contact between metal and a semiconductor is utilized. Accordingly, Schottky barrier diodes operate at high speeds and are also suitable for use in, for example, a high-frequency region.

It is assumed that the above graphene nanoribbon or carbon nanotube is used for forming a Schottky barrier diode. Even if a Schottky barrier is formed on one electrode side, a decrease in contact resistance on the other electrode side may be insufficient. As a result, the formed Schottky barrier diode may fail to exhibit good diode characteristics.

SUMMARY

According to an aspect, there is provided a Schottky barrier diode including a graphene nanoribbon and a first electrode and a second electrode respectively connected to both ends of the graphene nanoribbon, the graphene nanoribbon including a first part having a first electronic state and a second part connected to the first part in a length direction of the graphene nanoribbon and having a second electronic state different from the first electronic state.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 4A through 4C are views for describing a Schottky barrier diode formation method (part 2);

FIGS. 12A and 12B each illustrate a density-of-state distribution of a graphene nanoribbon connected to an electrode;

DESCRIPTION OF EMBODIMENTS

First a first embodiment will be described.

Figure 1A:
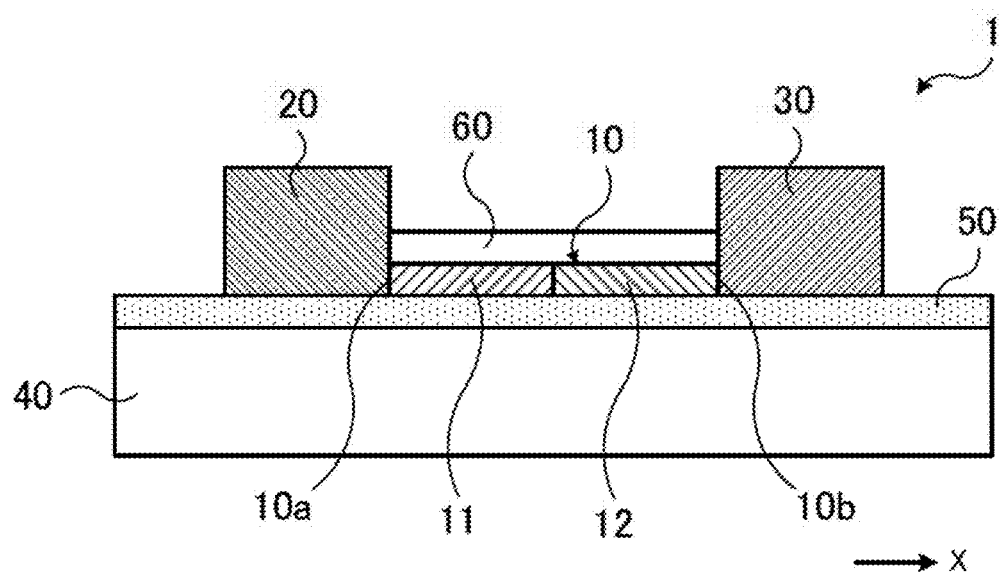
FIGS. 1A and 1B illustrate an example of a Schottky barrier diode according to a first embodiment.
Figure 1B:
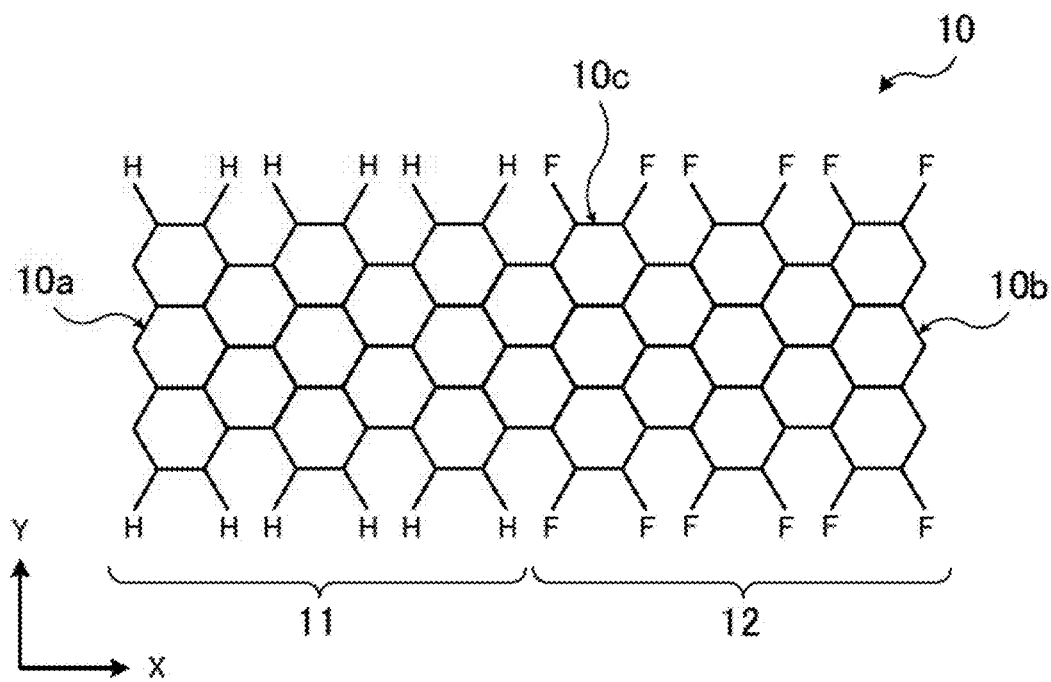
Figure 2A:
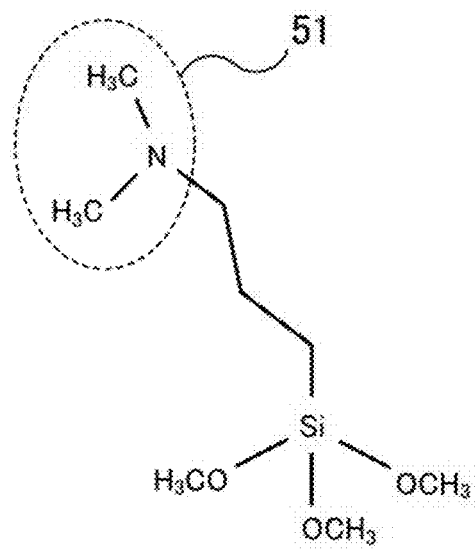
FIGS. 2A and 2B illustrate examples of a material for a film used in a Schottky barrier diode.
Figure 2B:
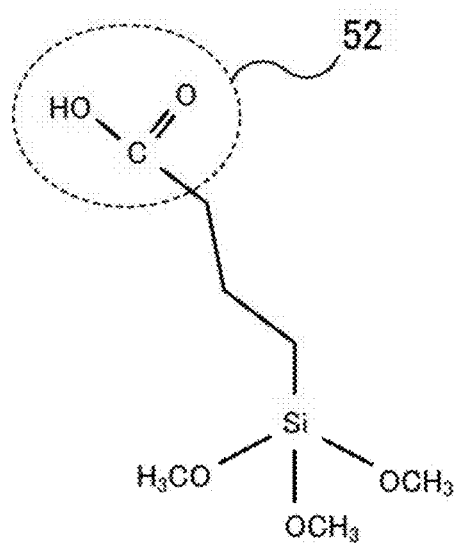

FIGS. 1A and 1B illustrate an example of a Schottky barrier diode according to a first embodiment. FIG. 1A is a fragmentary schematic sectional view of a Schottky barrier diode according to a first embodiment. FIG. 1B is a schematic view of an example of a graphene nanoribbon used in the Schottky barrier diode according to the first embodiment. Furthermore, FIGS. 2A and 2B illustrate examples of a material for a film used in a Schottky barrier diode.

A Schottky barrier diode 1 illustrated in FIG. 1A includes a graphene nanoribbon 10, an electrode 20 connected to one end 10a of the graphene nanoribbon 10, and an electrode 30 connected to the other end 10b of the graphene nanoribbon 10. For example, the graphene nanoribbon 10, the electrode 20, and the electrode 30 are placed over a determined film 50 formed over a support substrate 40. The electrode 20 and the electrode 30 may be placed directly over the support substrate 40 without placing the film 50 therebetween. An insulating substrate, such as a sapphire substrate, is used as the support substrate 40. A passivation film 60 made of hexagonal boron nitride (h-BN) or the like is placed over the graphene nanoribbon 10 formed over the film 50.

FIG. 1B illustrates a graphene nanoribbon with a width corresponding to three six-membered rings and armchair type edges 10c in a length direction X, as an example of the graphene nanoribbon 10. An end 10a and an end 10b of the graphene nanoribbon 10 to which the electrode 20 and the electrode 30, respectively, are connected are zigzag type ends.

The edges 10c in the length direction X of the graphene nanoribbon 10 on an electrode 20 side and an electrode 30 side are terminated with different modifying groups. In this example, the edges 10c of the graphene nanoribbon 10 on the electrode 20 side are terminated with hydrogen (H) and the edges 10c of the graphene nanoribbon on the electrode 30 side are terminated with fluoro groups (F).

A part 11 of the graphene nanoribbon 10 in which the edges 10c are terminated with H and a part 12 of the graphene nanoribbon 10 in which the edges 10c are terminated with F have different electronic states. On the basis of the difference in electronic state between the part 11 and the part 12 and materials (their work functions) for the electrodes 20 and 30, the part 11 of the graphene nanoribbon 10 in which the edges 10c are terminated with H forms a Schottky connection with the electrode 20 and the part 12 of the graphene nanoribbon 10 in which the edges 10c are terminated with F forms an ohmic connection with the electrode 30. This will be described later.

For example, a laminated structure (Cr/Au) in which gold (Au) is laminated over chromium (Cr) is used as the electrode 20 (Schottky electrode) connected to the part 11 of the graphene nanoribbon 10 in which the edges 10c are terminated with H. For example, a laminated structure (Ti/Au) in which Au is laminated over Ti is used as the electrode 30 (ohmic electrode) connected to the part 12 of the graphene nanoribbon 10 in which the edges 10c are terminated with F. Cr of the electrode 20 and Ti of the electrode 30 are in contact with the end 10a of the part 11 of the graphene nanoribbon 10 and the end 10b of the part 12 of the graphene nanoribbon 10 respectively.

In this example, Cr whose work function is slightly higher (by about 0.2 eV)) than that of Ti is used for forming the electrode 20 which is a Schottky electrode. As with the electrode 30 which is an ohmic electrode, however, Ti may be used for forming the electrode 20. The reason for this is as follows. The graphene nanoribbon 10 does not have a uniform electronic state. The graphene nanoribbon 10 has a structure in which the part 11 and the part 12 having different electronic states are combined. With a Schottky barrier diode using a carbon nanotube which is difficult to dope, it is difficult to adopt such an electrode structure.

As illustrated in FIG. 1A, the graphene nanoribbon 10 is placed over the determined film 50. A film having the function of doping the graphene nanoribbon 10 is used as the film 50. For example, what is called a self assembled monolayer (SAM) having the property of donating electrons to the graphene nanoribbon 10 is used as the film 50.

An example of a material for an electron-donating SAM is illustrated in FIG. 2A. FIG. 2A illustrates N,N-dimethyl-3-aminopropyl trimethoxysilane which is an example of a molecule having an electron-donating dimethylamino group ($N(CH_3)_2$ in a dotted-line frame 51 of FIG. 2A). Alternatively, N,N-dimethyl-3-aminopropyl triethoxysilane, N-methyl-3-aminopropyl trimethoxysilane, N-methyl-3-aminopropyl triethoxysilane, 3-aminopropyl trimethoxysilane, 3-aminopropyl triethoxysilane, or the like may be used as a material for an electron-donating SAM.

Both of the part 11 and the part 12 of the graphene nanoribbon 10 are placed over the electron-donating film 50. By doing so, electrons are donated from the film 50. As a result, the graphene nanoribbon 10 is doped (n-doped).

As illustrated in FIG. 1A, for example, the graphene nanoribbon 10 is connected to the electrode 20 only at the end 10a and is connected to the electrode 30 only at the end 10b. If the electrode 20 and the electrode 30 are connected in this way to the graphene nanoribbon 10, the accuracy of doping by the film 50 is high compared with a case where electrodes are connected so as to cover both end portions including the end 10a and the end 10b. If the graphene nanoribbon 10 is doped with accuracy, contact resistance decreases. As a result, diode characteristics are improved.

Next, a method for forming the Schottky barrier diode 1 having the above structure will be described.

FIGS. 3A through 9C are views for describing a Schottky barrier diode formation method.

FIGS. 3A through 3C and FIGS. 4A through 4C illustrate an example of a graphene nanoribbon formation method.

Figure 3C:
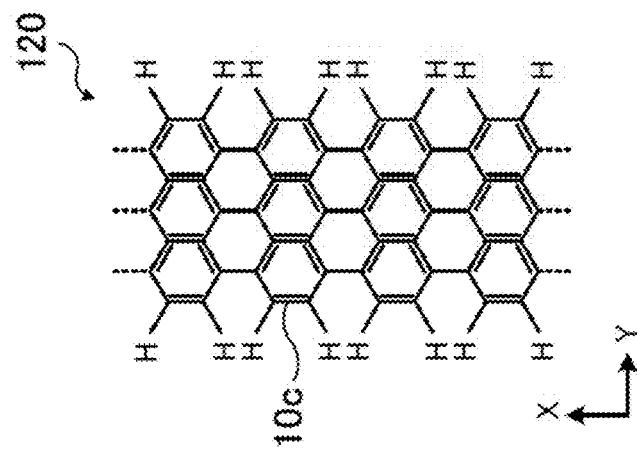
FIGS. 3A through 3C are views for describing a Schottky barrier diode formation method (part 1)
Figure 3B:
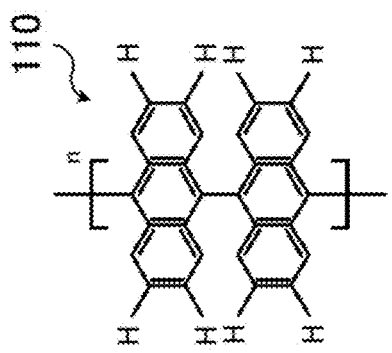
Figure 3A:
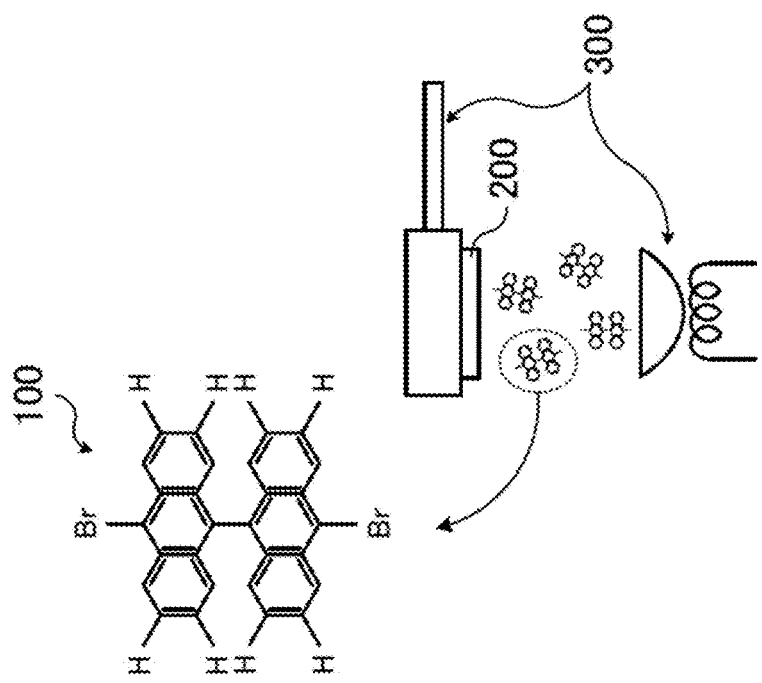

As illustrated in FIG. 3A, first an anthracene dimer 100 (including edges terminated with bromo groups (Br)) part of whose edges are terminated with H is deposited over a substrate 200 by thermal deposition with an evaporation system 300. An Au substrate (such as an Au (111) substrate) or a silver (Ag) substrate (such as an Ag (111) substrate) is used as the substrate 200. When the anthracene dimer 100 is deposited, the substrate 200 is heated to, for example, about 180 to 250° C. The deposited anthracene dimers 100 are polymerized by radical polymerization. As a result, as illustrated in FIG. 3B, a polymer 110 (polymerization degree is n) of the anthracene dimers 100 including edges terminated with H is formed over the substrate 200.

The temperature of the substrate 200 is raised further to, for example, about 350 to 450° C. and is kept at that temperature for about 10 to 20 minutes. By doing so, a cyclodehydrogenation reaction occurs in the polymer 110 of the anthracene dimers 100 and a graphene nanoribbon 120 illustrated in FIG. 3C is formed over the substrate 200. The formed graphene nanoribbon 120 has a uniform width of about 0.7 nm. Edges 10c in a length direction X of the graphene nanoribbon 120 are armchair type edges and are terminated with H.

After the graphene nanoribbon 120 whose edges 10c are terminated with H is formed, an anthracene dimer 130 (including edges terminated with Br) part of whose edges are terminated with F is deposited, as illustrated in FIG. 4A, by thermal deposition over the substrate 200 over which the graphene nanoribbon 120 is formed. When the anthracene dimer 130 is deposited, heating is performed in the same way that is described above. By doing so, as illustrated in FIG. 4B, the graphene nanoribbon 120 whose edges 10c are terminated with H and a polymer 140 (polymerization degree is m) of the anthracene dimers 130 including edges terminated with F connect.

Furthermore, the temperature of the substrate 200 is raised and kept in the same way that is described above. By doing so, a cyclodehydrogenation reaction occurs in the polymer 140 and a graphene nanoribbon 150 illustrated in FIG. 4C is formed. Edges 10c in the length direction X of the graphene nanoribbon 150 are armchair shaped and are terminated with F. As a result, a structure in which the graphene nanoribbon 120 including the edges 10c terminated with H is combined with the graphene nanoribbon 150 including the edges 10c terminated with F is obtained.

By adopting the above method, the graphene nanoribbon 10 having the graphene nanoribbon 120 including the edges 10c terminated with H as the above part 11 (FIGS. 1A and 1B) and having the graphene nanoribbon 150 including the edges 10c terminated with F as the above part 12 (FIGS. 1A and 1B) is obtained.

In the above example, an anthracene dimer is used as a precursor of the graphene nanoribbon 10. A pentacene dimer, a heptacene dimer, a nonacene dimer or the like may be used as a precursor of the graphene nanoribbon 10 according to the width of the graphene nanoribbon 10 formed.

Figure 5A:
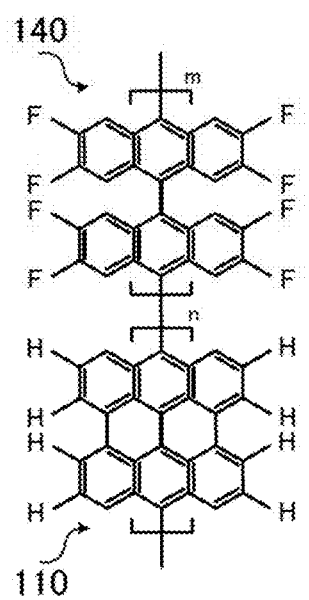
FIGS. 5A and 5B are views for describing a Schottky barrier diode formation method (part 3)
Figure 5B:
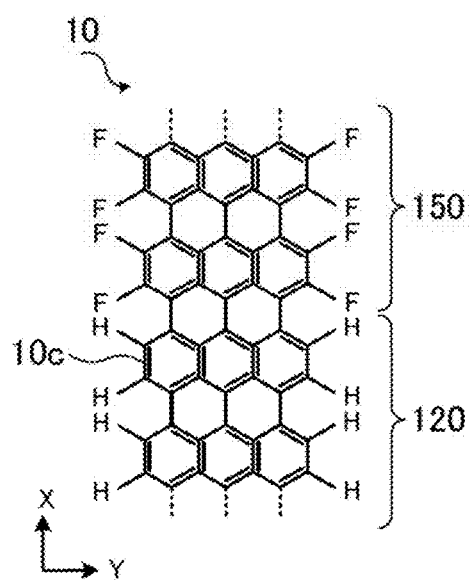

Furthermore, FIGS. 5A and 5B illustrate another example of a graphene nanoribbon formation method.

In this example, a polymer 110 of anthracene dimers 100 including edges terminated with H is formed in accordance with the above example of FIGS. 3A and 3B. A polymer 140 of anthracene dimers 130 including edges terminated with F is then formed in accordance with the above example of FIGS. 4A and 4B. As a result, as illustrated in FIG. 5A, a combination (polymer) of the polymer 110 before a cyclodehydrogenation reaction including the edges terminated with H and the polymer 140 before a cyclodehydrogenation reaction including the edges terminated with F is obtained.

When the temperature of a substrate is raised and kept for the combination of the polymer 110 and the polymer 140 in the same way that is described above, a cyclodehydrogenation reaction occurs in the polymer 110 and the polymer 140. As a result, as illustrated in FIG. 5B, a combination of a graphene nanoribbon 120 including edges 10c terminated with H and a graphene nanoribbon 150 including edges 10c terminated with F, that is to say, the above graphene nanoribbon 10 is formed.

By using the method illustrated in FIGS. 5A and 5B, the graphene nanoribbon 10 having the above parts 11 and 12 (FIGS. 1A and 1B) may be obtained.

FIGS. 6A through 6C, FIGS. 7A through 7C, and FIGS. 8A through 8C illustrate an example of a Schottky barrier diode formation method. Each of FIGS. 6A through 6C, FIGS. 7A through 7C, and FIGS. 8A through 8C is a fragmentary schematic sectional view of a process of an example of a Schottky barrier diode formation method.

Figure 6A:
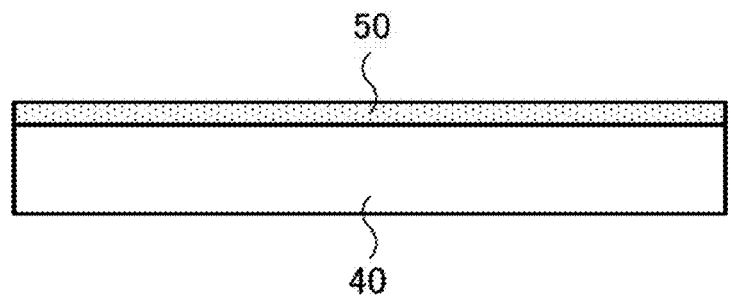
FIGS. 6A through 6C are views for describing a Schottky barrier diode formation method (part 4)

As illustrated in FIG. 6A, a SAM including an electron-donating group is formed as a film 50 over a support substrate 40 such as a sapphire substrate. For example, first the support substrate 40 and n-type dopant molecules, such as N,N-dimethyl-3-aminopropyl trimethoxysilane, in an open container including an electron-donating group are sealed into an airtight vessel in a glove box at atmospheric pressure. After that, the airtight vessel is put into an electric furnace and heating treatment is performed for about several hours at a temperature of, for example, 100° C. By doing so, a monolayer of N,N-dimethyl-3-aminopropyl trimethoxysilane (($CH_3$)$_2$N-SAM) is formed over the support substrate 40. Each of ethanol treatment, toluene treatment, potassium hydroxide treatment, and nitric acid treatment is then performed for about 10 minutes. Nitrogen ($N_2$) blow treatment is performed after pure water cleaning. As a result, the film 50 containing N($CH_3$)$_2$, which is an electron-donating group, is formed over the support substrate 40.

Figure 6B:
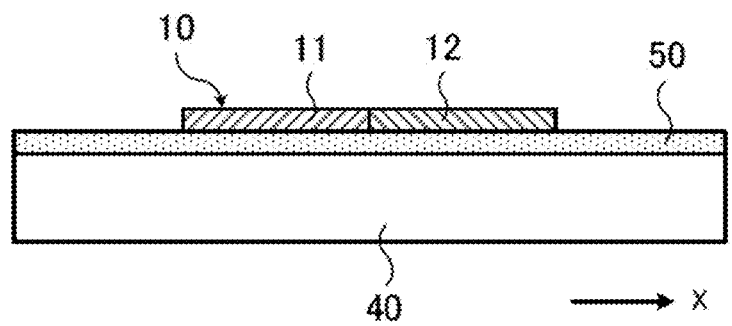

The film 50 is formed over the support substrate 40 so that, for example, N($CH_3$)$_2$ which is an electron-donating group will be situated on an upper side. After the film 50 is formed, a graphene nanoribbon 10 obtained by the use of the method illustrated in FIGS. 3A through 5B is transferred, as illustrated in FIG. 6B, onto a surface of the formed film 50 on the side on which N($CH_3$)$_2$, for example, is situated.

Figure 6C:
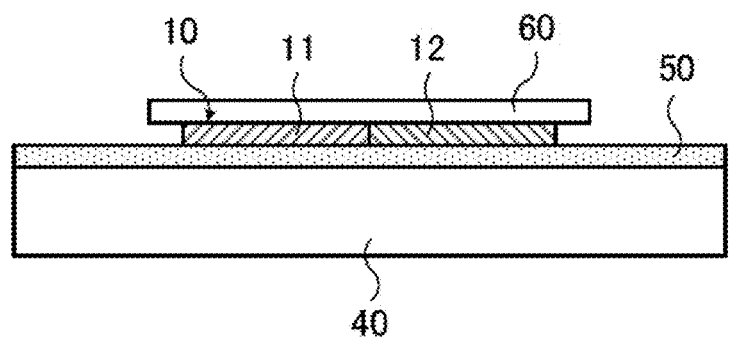

Furthermore, as illustrated in FIG. 6C, a passivation film 60, such as h-BN, is formed over the transferred graphene nanoribbon 10. h-BN formed as the passivation film 60 over the graphene nanoribbon 10 may be formed by the method of peeling and transferring from a crystal or be formed by the use of a chemical vapor deposition (CVD) method.

Figure 7A:
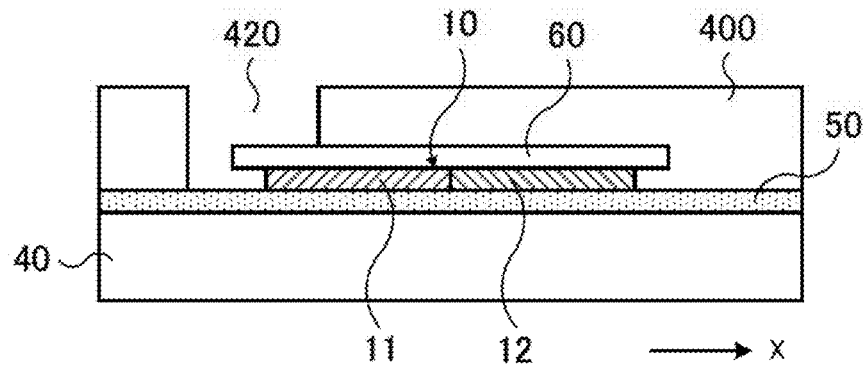
FIGS. 7A through 7C are views for describing a Schottky barrier diode formation method (part 5)

As illustrated in FIG. 7A, a resist 400 having an opening portion 420 corresponding to one end portion in a length direction X of the graphene nanoribbon 10 is then formed. For example, a resist 400 having an opening portion 420 corresponding to an end portion on the part 11 side on which edges are terminated with H is formed.

Figure 7B:
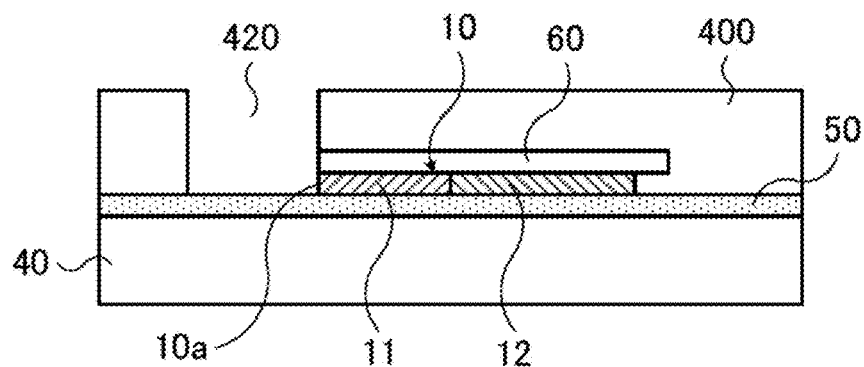

As illustrated in FIG. 7B, the passivation film 60 and the graphene nanoribbon 10 in the opening portion 420 are removed by performing argon (Ar) ion milling with the resist 400 as a mask. At that time the film 50 in the opening portion 420, together with the passivation film 60 and the graphene nanoribbon 10 in the opening portion 420, may be removed. As a result, an end 10a of the graphene nanoribbon 10 is exposed on a side wall of the opening portion 420.

Figure 7C:
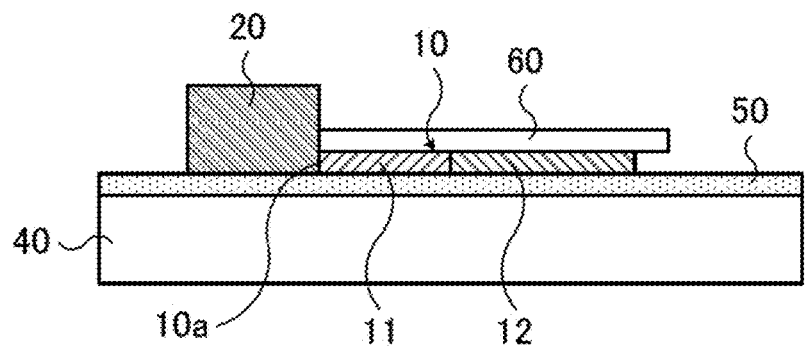

Electrode materials, such as Cr and Au, are then deposited in order in the opening portion 420 of the resist 400 and over an upper surface of the resist 400. In that case, the thickness of Cr is, for example, about 5 nm and the thickness of Au is, for example, about 10 nm. After the electrode materials are formed, the resist 400 and the electrode materials deposited over the upper surface thereof are removed by a lift off method. By doing so, an electrode 20 illustrated in FIG. 7C is formed. The electrode 20 is formed so as to be in contact with the end 10a of the graphene nanoribbon 10 on the part 11 side on which the edges are terminated with H.

The same process is performed on the other end portion in the length direction X of the graphene nanoribbon 10. In this example, the same process is performed on an end portion on the part 12 side on which the edges are terminated with F.

Figure 8A:
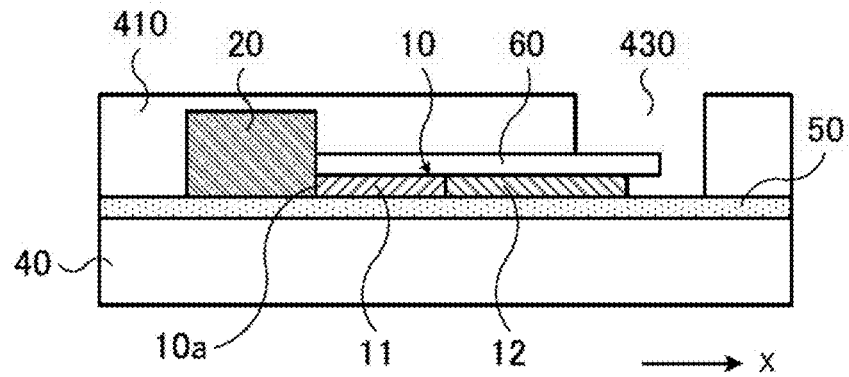
FIGS. 8A through 8C are views for describing a Schottky barrier diode formation method (part 6)

That is to say, as illustrated in FIG. 8A, a resist 410 having an opening portion 430 corresponding to an end portion of the graphene nanoribbon 10 on the part 12 side on which the edges are terminated with F is formed.

Figure 8B:
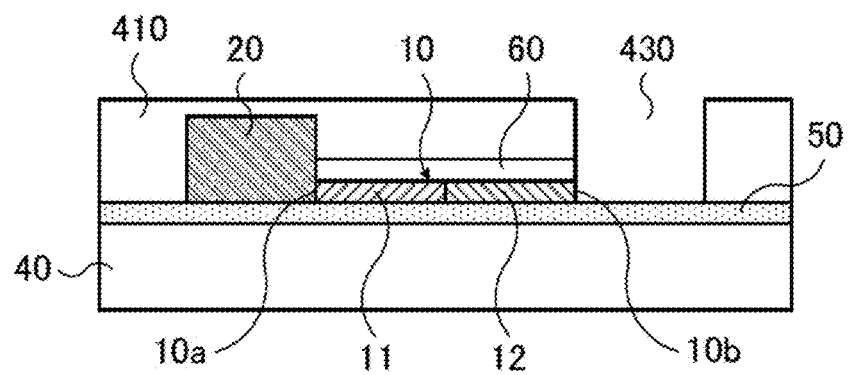

As illustrated in FIG. 8B, the passivation film 60 and the graphene nanoribbon 10 in the opening portion 430 are removed by performing Ar ion milling with the resist 410 as a mask. At that time the film 50 in the opening portion 430, together with the passivation film 60 and the graphene nanoribbon 10 in the opening portion 430, may be removed. As a result, an end 10b of the graphene nanoribbon 10 is exposed on a side wall of the opening portion 430.

Figure 8C:
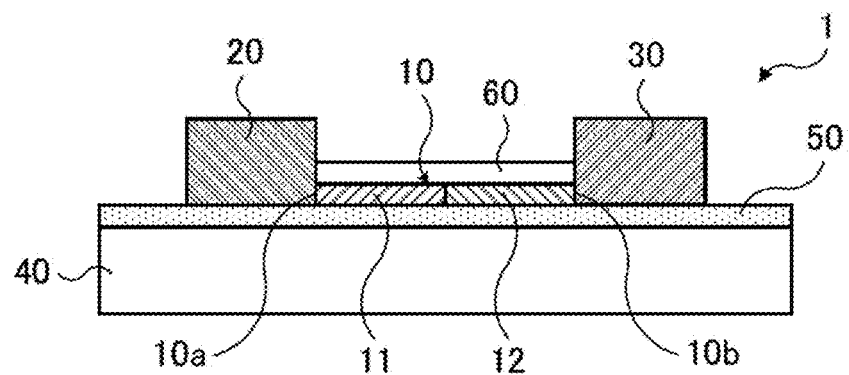

Electrode materials, such as Ti and Au, are then deposited in order in the opening portion 430 of the resist 410 and over an upper surface of the resist 410. In that case, the thickness of Ti is, for example, about 5 nm and the thickness of Au is, for example, about 10 nm. After the electrode materials are formed, the resist 410 and the electrode materials deposited over the upper surface thereof are removed by the lift off method. By doing so, an electrode 30 illustrated in FIG. 8C is formed. The electrode 30 is formed so as to be in contact with the end 10b of the graphene nanoribbon 10 on the part 12 side on which the edges are terminated with F.

In the example of FIGS. 7A through 7C and 8A through 8C, electrode materials of different kinds are used for forming the electrode 20 and the electrode 30. If electrode materials of the same kinds are used for forming the electrode 20 and the electrode 30, then a method illustrated in FIGS. 9A through 9C may be adopted.

Figure 9A:
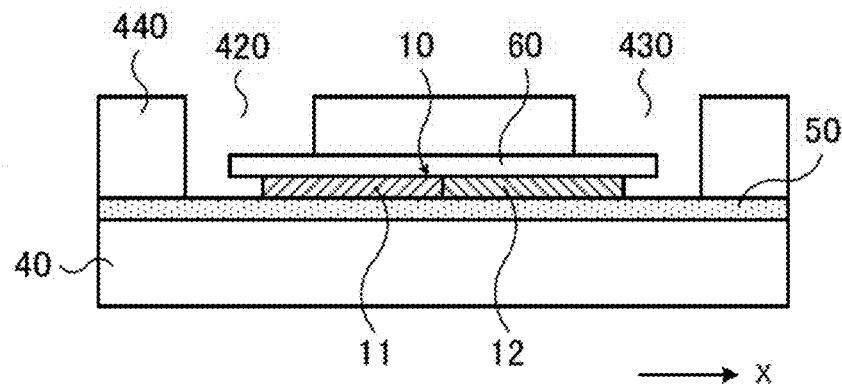
FIGS. 9A through 9C are views for describing a Schottky barrier diode formation method (part 7)
Figure 9B:
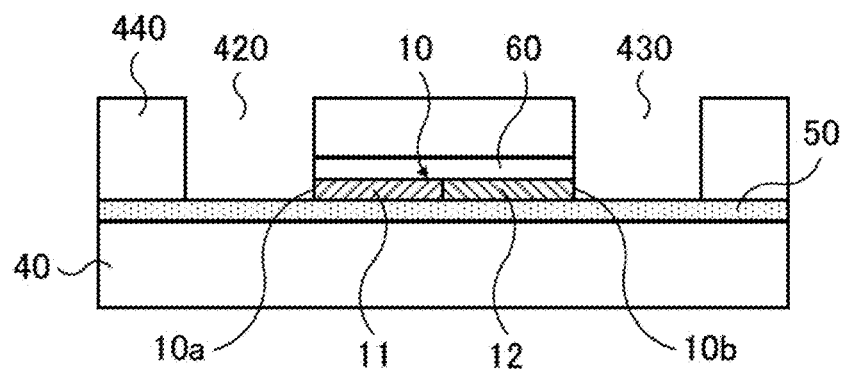
Figure 9C:
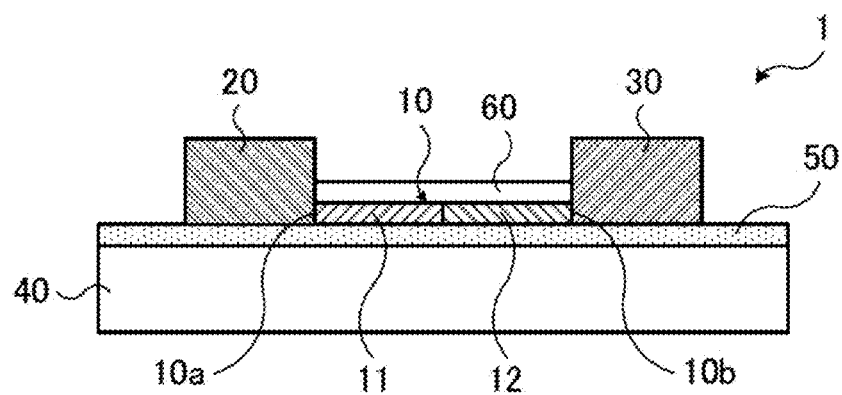

FIGS. 9A through 9C illustrate another example of a Schottky barrier diode formation method. Each of FIGS. 9A through 9C is a fragmentary schematic sectional view of a process of another example of a Schottky barrier diode formation method.

In this example, processes illustrated in FIGS. 9A through 9C are performed after the process illustrated in FIG. 6C is performed.

As illustrated in FIG. 9A, first a resist 440 is formed. The resist 440 has an opening portion 420 corresponding to an end portion of the graphene nanoribbon 10 on the part 11 side on which edges are terminated with H and an opening portion 430 corresponding to an end portion of the graphene nanoribbon 10 on the part 12 side on which the edges are terminated with F.

As illustrated in FIG. 9B, the passivation film 60 and the graphene nanoribbon 10 in the opening portion 420 and the opening portion 430 are removed by performing Ar ion milling with the resist 440 as a mask. At that time the film 50 in the opening portion 420 and the opening portion 430, together with the passivation film 60 and the graphene nanoribbon 10 in the opening portion 420 and the opening portion 430, may be removed. As a result, an end 10a and an end 10b of the graphene nanoribbon 10 are exposed on side walls of the opening portion 420 and the opening portion 430 respectively.

Electrode materials, such as Ti and Au, are then deposited in order in the opening portion 420 and the opening portion 430 of the resist 440 and over an upper surface of the resist 440. The resist 440 and the electrode materials deposited over the upper surface thereof are removed by the lift off method. By doing so, an electrode 20 and an electrode 30 illustrated in FIG. 9C are formed at the same time by the use of electrode materials of the same kinds. The electrode 20 is in contact with the end 10a on the part 11 side on which the edges are terminated with H. The electrode 30 is in contact with the end 10b on the part 12 side on which the edges are terminated with F.

For example, the methods described in FIGS. 3A through 9C are used for forming the Schottky barrier diode 1 having the structure illustrated in FIGS. 1A and 1B.

The Schottky barrier diode 1 having the above structure will be described further.

Figure 10:
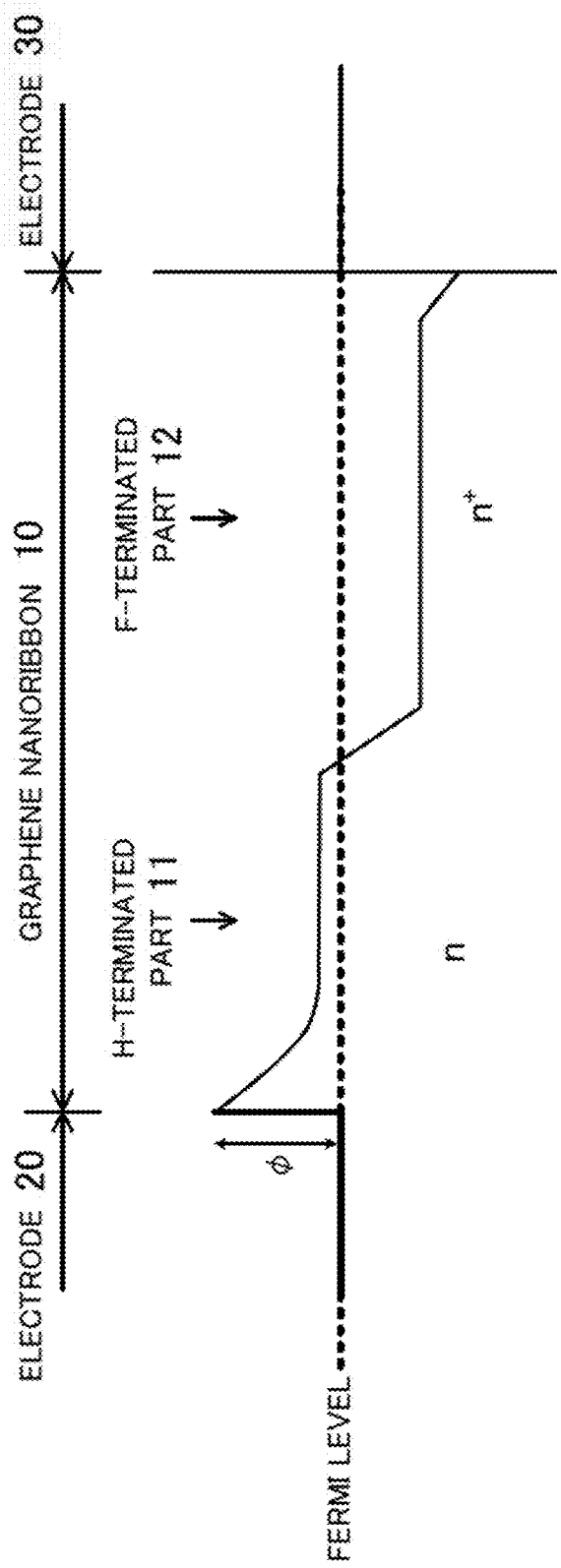
FIG. 10 is a schematic view of band alignment of the Schottky barrier diode according to the first embodiment.
Figure 11:
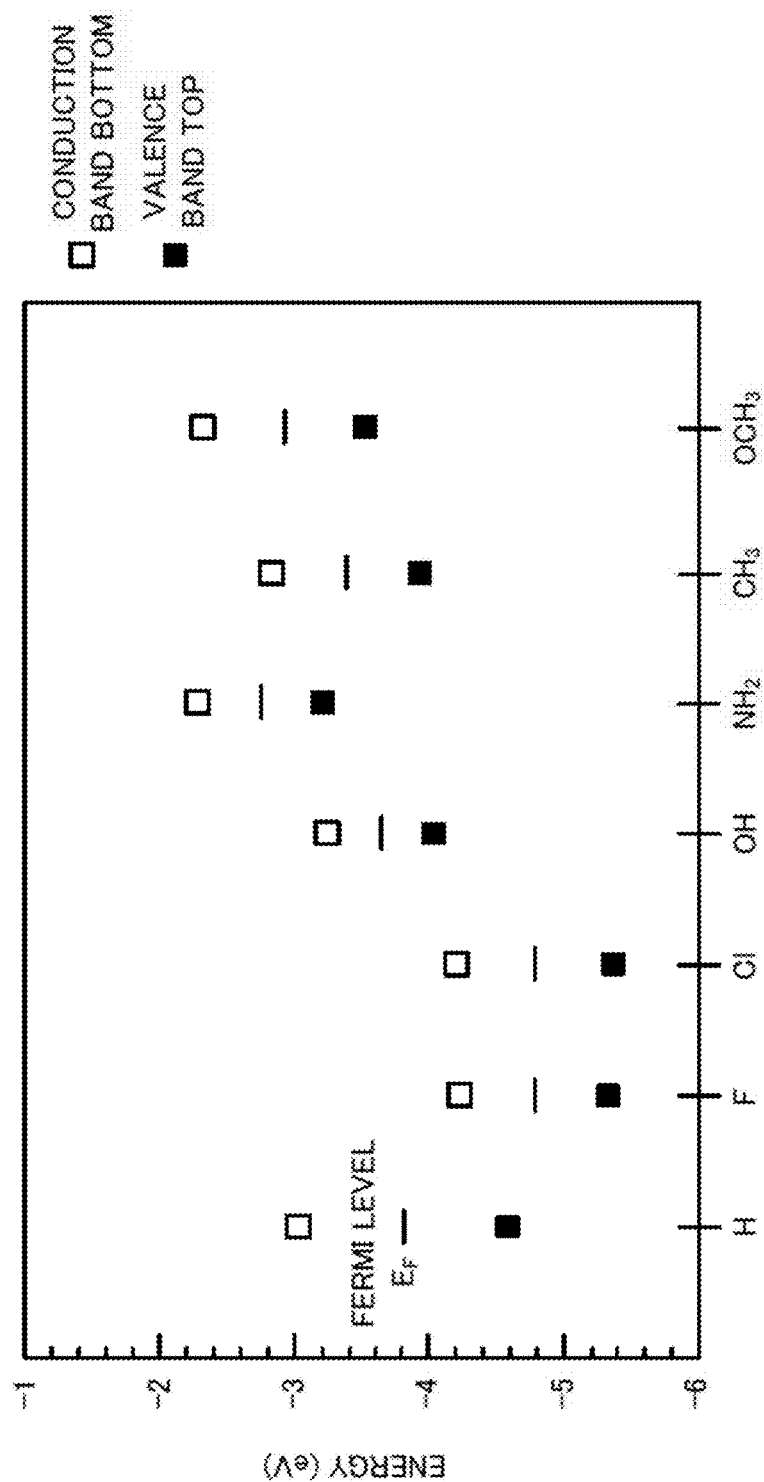
FIG. 11 illustrates the relationship between a modifying group of an armchair type edge and an electronic state of a graphene nanoribbon.

FIG. 10 is a schematic view of band alignment of the Schottky barrier diode according to the first embodiment. Furthermore, FIG. 11 illustrates the relationship between a modifying group of an armchair type edge and an electronic state of a graphene nanoribbon. FIG. 11 illustrates energy (eV) at the conduction band bottom, the valence band top, and the Fermi level ($E_F$) of a graphene nanoribbon with the edges terminated with each modifying group.

With the Schottky barrier diode 1 (FIG. 1A and FIG. 1B) band alignment illustrated in FIG. 10 is obtained.

The Schottky barrier diode 1 includes the graphene nanoribbon 10 placed between the electrode 20 and the electrode 30 over the electron-donating film 50. The graphene nanoribbon 10 has the part (H-terminated part) 11 on the electrode 20 side in which the edges 10c are terminated with H and the part (F-terminated part) 12 on the electrode 30 side in which the edges 10c are terminated with F.

A graphene nanoribbon has different electronic states according to the type of a modifying group with which an armchair type edge in a length direction is terminated. As illustrated in FIG. 11, energy at the conduction band bottom, the Fermi level, and the valence band top of a graphene nanoribbon in which an armchair type edge in a length direction is terminated with H is higher than energy at the conduction band bottom, the Fermi level, and the valence band top, respectively, of a graphene nanoribbon in which an armchair type edge in a length direction is terminated with F. With a graphene nanoribbon obtained by combining a graphene nanoribbon in which an armchair type edge in a length direction is terminated with H and a graphene nanoribbon in which an armchair type edge in a length direction is terminated with F, the latter graphene nanoribbon forms an n-type ohmic connection with a specific metal electrode more easily than the former graphene nanoribbon.

With the Schottky barrier diode 1 (FIG. 1A and FIG. 1B), the graphene nanoribbon 10 has a structure in which the part 11 where the edges 10c are terminated with H and the part 12 where the edges 10c are terminated with F are combined. Furthermore, the part 11 and the part 12 of the graphene nanoribbon 10 are n-doped by the electron-donating film 50. In addition, the electrode 20 having a determined work function is connected to the end 10a of the part 11 of the graphene nanoribbon 10 where the edges 10c are terminated with H, and the electrode 30 having a determined work function is connected to the end 10b of the part 12 of the graphene nanoribbon 10 where the edges 10c are terminated with F.

On the basis of a combination of the part 11 and the part 12 and connection between the graphene nanoribbon 10 and the electrodes 20 and 30, the part 11, the part 12, the electrode 20, and the electrode 30 are equal in Fermi level in a thermal equilibrium state. At this time there is a difference in electronic state between the part 11 and the part 12 of the graphene nanoribbon 10. Accordingly, as illustrated in FIG. 10, the part 11 on the electrode 20 side where the edges 10c are terminated with H is of an n type and the part 12 on the electrode 30 side where the edges 10c are terminated with F is of an $n^+$ type. A Schottky barrier Φ is formed between the part 11 (of an n type) of the graphene nanoribbon 10 where the edges 10c are terminated with H and the electrode 20, and there is a Schottky connection between them. On the other hand, there is an ohmic connection between the part 12 (of an $n^+$ type) of the graphene nanoribbon 10 where the edges 10c are terminated with F and the electrode 30.

FIGS. 12A and 12B each illustrate a density-of-state distribution of a graphene nanoribbon connected to an electrode. FIG. 12A illustrates a density-of-state distribution for a graphene nanoribbon having edges terminated with H that is connected to Ti. FIG. 12B illustrates a density-of-state distribution for a graphene nanoribbon having edges terminated with F that is connected to Ti.

As is seen from FIG. 12A, for example, when the part 11 of the graphene nanoribbon 10 where the edges 10c are terminated with H is connected to the Ti electrode 20, there is a Schottky barrier 70 and the part 11 forms a Schottky connection with Ti of the electrode 20. On the other hand, as is seen from FIG. 12B, when the part 12 of the graphene nanoribbon 10 where the edges 10c are terminated with F is connected to the Ti electrode 30, there is no Schottky barrier and the part 12 forms an ohmic connection with Ti of the electrode 30. Typically, the contact resistance of an ohmic connection portion of the graphene nanoribbon 10 and the electrode 30 is about 40 to 50 kΩ).

The diode characteristics of the Schottky barrier diode 1 having the above structure will now be described.

Figure 13A:
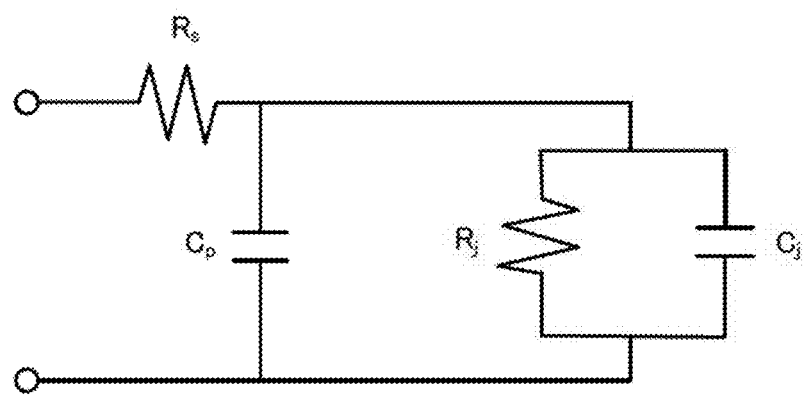
FIGS. 13A and 13B are views for describing the structure of a Schottky barrier diode used for evaluating diode characteristics.
Figure 13B:
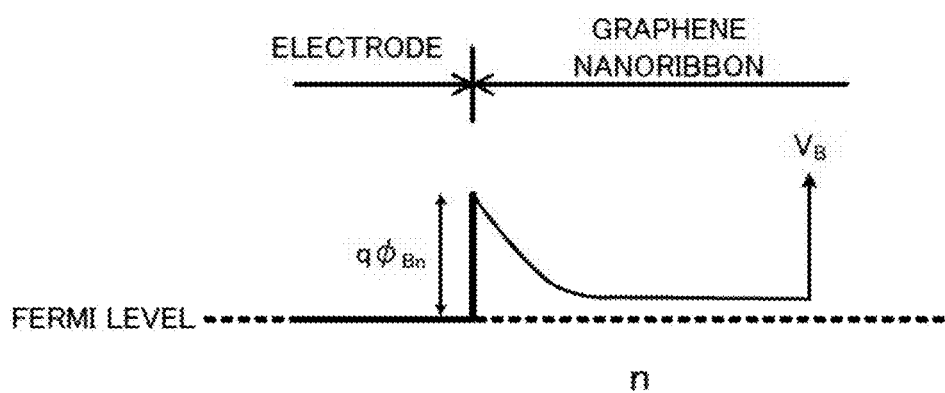

FIGS. 13A and 13B are views for describing the structure of a Schottky barrier diode used for evaluating diode characteristics. FIG. 13A is a circuit diagram of an equivalent circuit of a Schottky barrier diode. FIG. 13B is a schematic view of a Schottky barrier.

In FIG. 13A, $R_s$ represents series resistance including contact resistance, $R_j$ represents junction resistance, $C_p$ represents parasitic capacitance, and $C_j$ represents junction capacitance. It is assumed that the series resistance $R_s$ is 50 kΩ. In order to estimate the junction resistance $R_j$, it is assumed that a thermionic emission model is given and that there is an n-type Schottky barrier (whose height is $\Phi_{Bn}$) between a graphene nanoribbon (which has an armchair type edge and which is of an n type) and an electrode illustrated in FIG. 13B. However, because a graphene nanoribbon having an armchair type edge illustrated in FIG. 13B is one-dimensional, another expression for deriving a current value will be obtained if an ordinary three-dimensional thermal electron emission model is given. The details will be omitted, but a current value $J_n$ is given by $$J_n = qkT/h \times \exp(-q\Phi_{Bn}/kT) \times [\exp\{(q(V_B - R_s J_n)/kT\} - 1] \quad (1)$$

where q is an elementary charge, k is a Boltzmann's constant, T is an absolute temperature, h is a Planck's constant, and $V_B$ is a bias voltage. Because $J_n$ is included in both sides of expression (1), there is a need to numerically solve expression (1).

Figure 14:
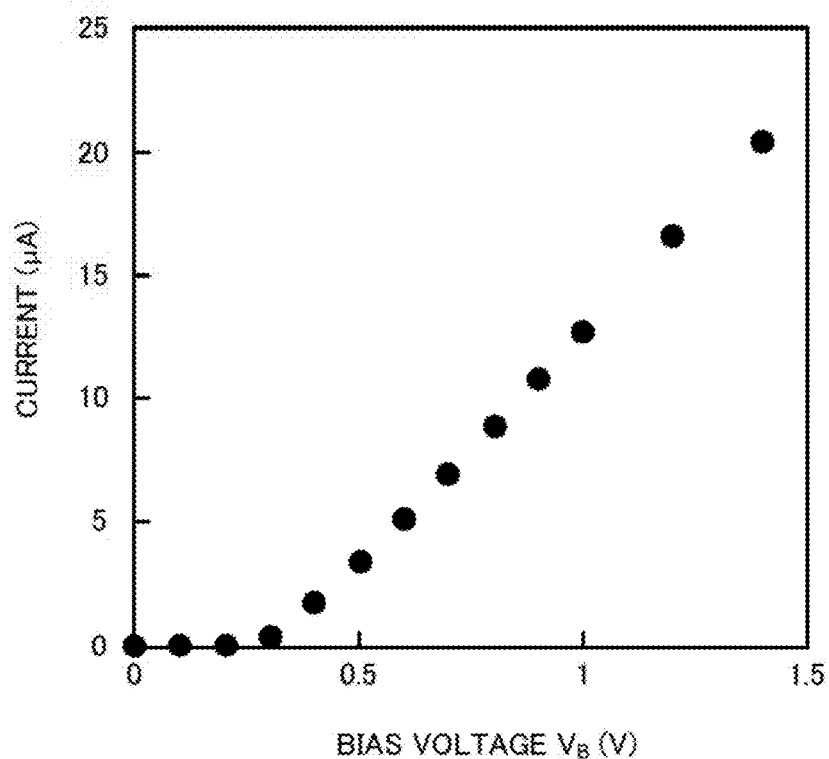
FIG. 14 illustrates the relationship between a bias voltage and a current.

FIG. 14 illustrates the relationship between the bias voltage $V_B$ and a current obtained with the Schottky barrier height $\Phi_{Bn}$ being 0.3 eV. In FIG. 14, a horizontal axis indicates the bias voltage $V_B$ (V) and a vertical axis indicates a current (μA).

On the basis of data indicated in FIG. 14, the junction resistance $R_j$ for the bias voltage $V_B$ being about 0.5 V is estimated at about 98 kΩ. The junction capacitance $C_j$ is estimated on the assumption that the width and thickness of the graphene nanoribbon are 1 nm and 0.34 nm respectively. However, the junction capacitance $C_j$ is far smaller than the parasitic capacitance $C_p$. When it is assumed that the length of the graphene nanoribbon between electrodes is about 100 nm, the parasitic capacitance $C_p$ will make the largest contribution.

The above parameters (simulation values) are summarized in Table 1. Parameters (experimental values) reported for a tunnel diode (backward diode) having a gallium arsenide antimonide (GaAsSb)/indium aluminum arsenide (InAlAs)/indium gallium arsenide (InGaAs) structure are also indicated in Table 1 for comparison (IEEE Transactions on Electron Device, Vol. 62, No. 3, pp. 1068-1071 (2015)).

A cut-off frequency $f_c$ of the Schottky barrier diode using the graphene nanoribbon obtained from the above parameters is about 5.3 THz. Voltage detection sensitivity $\beta_V$ at a frequency of 300 GHz is 1900000 V/W and is as many as about 1000 times higher than the value of the tunnel diode indicated in Table 1.

With the above Schottky barrier diode 1 using the graphene nanoribbon 10, it is known that compared with diodes using ordinary semiconductor materials, very good detection characteristics are obtained.

In the first embodiment, the n-type Schottky barrier diode 1 having the graphene nanoribbon 10 including the part 11 in which the edges 10c in the length direction X are terminated with H and the part 12 in which the edges 10c in the length direction X are terminated with F is taken as an example. Furthermore, if the same band alignment as with the above H and F is realized, edges in a length direction of a graphene nanoribbon may be terminated with modifying groups of other atoms or molecules to realize an n-type Schottky barrier diode. For example, on the basis of the relationship between a modifying group of an edge and an electronic state of a graphene nanoribbon illustrated in FIG. 11, a side of a graphene nanoribbon on which a Schottky connection is formed may be terminated with H and a side of the graphene nanoribbon on which an ohmic connection is formed may be terminated with a chloro group (Cl). By doing so, an n-type Schottky barrier diode which is similar to the above Schottky barrier diode 1 is realized.

As has been described, in the first embodiment the graphene nanoribbon 10 including the part 11 and the part 12 which differ in electronic state is used for realizing a Schottky connection with the electrode 20 on the part 11 side and realizing an ohmic connection with the electrode 30 on the part 12 side. By doing so, a high performance n-type Schottky barrier diode 1 having good diode characteristics is realized.

A second embodiment will now be described.

Figure 15A:
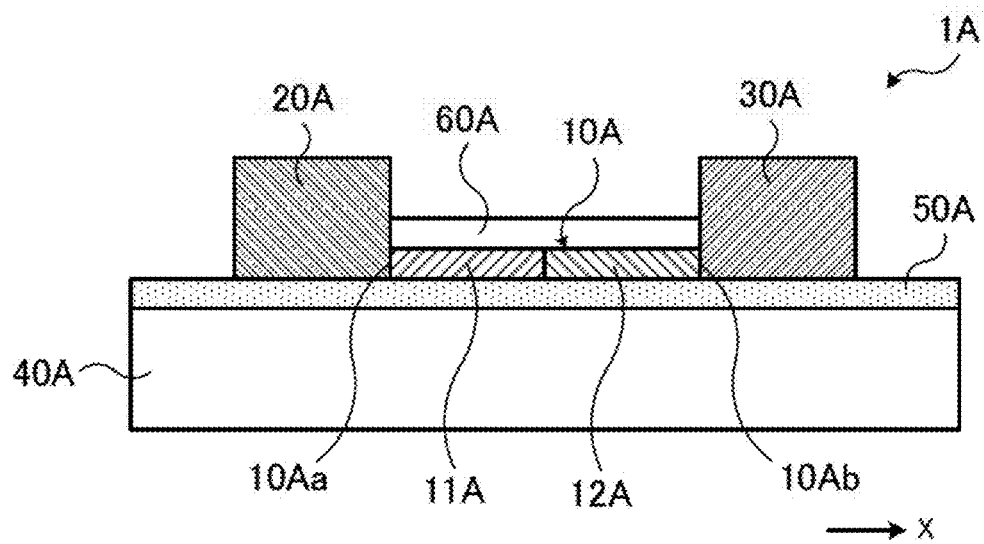
FIGS. 15A and 15B illustrate an example of a Schottky barrier diode according to a second embodiment.
Figure 15B:
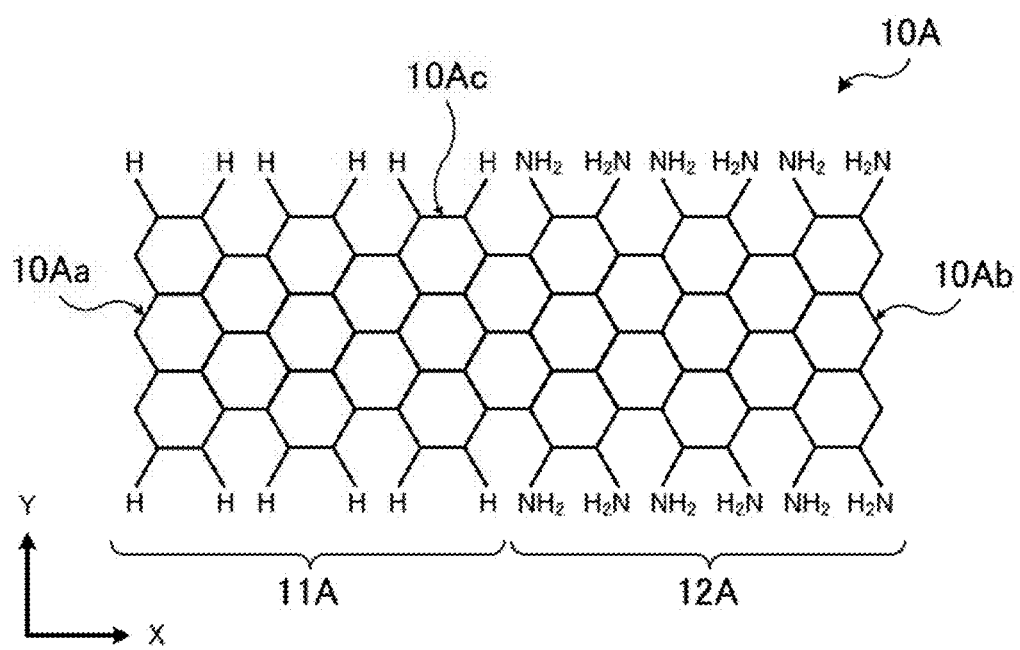

FIGS. 15A and 15B illustrate an example of a Schottky barrier diode according to a second embodiment. FIG. 15A is a fragmentary schematic sectional view of a Schottky barrier diode according to a second embodiment. FIG. 15B is a schematic view of an example of a graphene nanoribbon used in the Schottky barrier diode according to the second embodiment.

A Schottky barrier diode 1A illustrated in FIG. 15A includes a graphene nanoribbon 10A, an electrode 20A connected to one end 10Aa of the graphene nanoribbon 10A, and an electrode 30A connected to the other end 10Ab of the graphene nanoribbon 10A. The graphene nanoribbon 10A, the electrode 20A, and the electrode 30A are placed over a determined film 50A formed over a support substrate 40A such as a sapphire substrate. The electrode 20A and the electrode 30A may be placed directly over the support substrate 40A without placing the film 50A therebetween. A

TABLE 1

|  | area [μm²] | $C_j$ [aF] | $C_p$ [aF] | $R_j$ [kΩ] | $R_s$ [kΩ] | $\beta_V$ [V/W] | $f_c$ [THz] |
|---|---|---|---|---|---|---|---|
| GaAsSb/InAlAs/InGaAs tunnel diode (experimental values) | 0.8 × 0.8 | 3800 | — | 8000 | 0.13 | up to 1500 | 0.32 |
| graphene nanoribbon Schottky barrier diode (simulation values) | 1.0 × 0.34 | 0.0049 | 0.2 | 98 | 50 | $1.9 \times 10^6$ | 5.3 | passivation film 60A made of h-BN or the like is placed over the graphene nanoribbon 10A.

As illustrated in FIG. 15B, a graphene nanoribbon having a width corresponding to three six-membered rings is used as an example of the graphene nanoribbon 10A. Both edges 10Ac in a length direction X of the graphene nanoribbon are armchair type edges and an end 10Aa and an end 10Ab of the graphene nanoribbon are zigzag type ends. As illustrated in FIG. 15B, the edges 10Ac of the graphene nanoribbon 10A on the electrode 20A side are terminated with H and the edges 10Ac of the graphene nanoribbon 10A on the electrode 30A side are terminated with amino groups ($NH_2$).

A part 11A of the graphene nanoribbon 10A in which the edges 10Ac are terminated with H and a part 12A of the graphene nanoribbon 10A in which the edges 10Ac are terminated with $NH_2$ have different electronic states. On the basis of the difference in electronic state between the part 11A and the part 12A and materials (their work functions) for the electrodes 20A and 30A, the part 11A of the graphene nanoribbon 10A in which the edges 10Ac are terminated with H forms a Schottky connection with the electrode 20A and the part 12A of the graphene nanoribbon 10A in which the edges 10Ac are terminated with $NH_2$ forms an ohmic connection with the electrode 30A. This will be described later.

For example, Au is used as the electrode 20A (Schottky electrode) connected to the part 11A of the graphene nanoribbon 10A in which the edges 10Ac are terminated with H. For example, Pt is used as the electrode 30A (ohmic electrode) connected to the part 12A of the graphene nanoribbon 10A in which the edges 10Ac are terminated with $NH_2$. Au of the electrode 20A and Pt of the electrode 30A are in contact with the end 10Aa of the part 11A of the graphene nanoribbon 10A and the end 10Ab of the part 12A of the graphene nanoribbon 10A respectively. As illustrated in FIG. 15A, for example, the graphene nanoribbon 10A is connected to the electrode 20A only at the end 10Aa and is connected to the electrode 30A only at the end 10Ab.

As illustrated in FIG. 15A, the graphene nanoribbon 10A is placed over the determined film 50A having a doping function. In this example, a SAM having the property of withdrawing electrons from the graphene nanoribbon 10A is used as the film 50A.

An example of a material for an electron-withdrawing SAM is illustrated in FIG. 2B. FIG. 2B illustrates 3-carboxypropyl trimethoxysilane which is an example of a molecule having an electron-withdrawing carboxyl group (COOH in a dotted-line frame 52 of FIG. 2B). Alternatively, 3-carboxypropyl triethoxysilane, heptadecafluoro-1,1,2,2-tetrahydro-decyl-1-trimethoxysilane, or the like may be used as a material for an electron-withdrawing SAM.

Figure 16A:
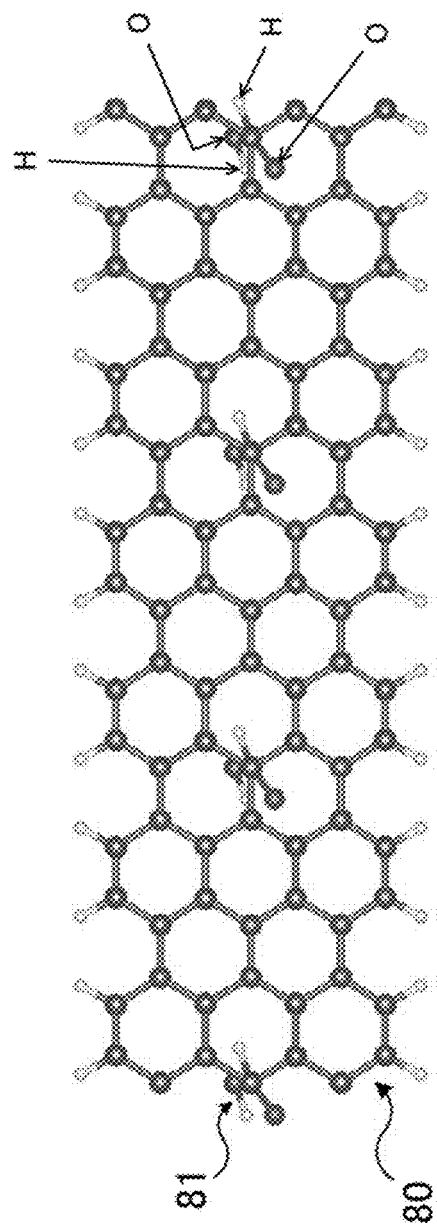
FIGS. 16A and 16B are views for describing electron transfer between a graphene nanoribbon and a carboxylic acid molecule which adsorbs on its surface.
Figure 16B:
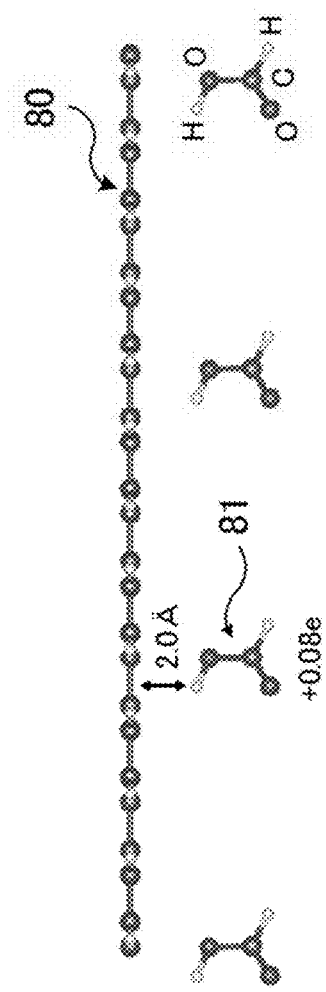

FIGS. 16A and 16B are views for describing electron transfer between a graphene nanoribbon and a carboxylic acid molecule which adsorbs on its surface. FIGS. 16A and 16B illustrate a state, when viewed from above and the side respectively, in which a carboxylic acid molecule (formic acid) adsorbs on the surface of a graphene nanoribbon.

As illustrated in FIGS. 16A and 16B, if carboxylic acid molecules 81 (formic acid) adsorb on the surface of a graphene nanoribbon 80 at an intermolecular distance of, for example, 2.0 Å, then 0.08 electrons per carboxylic acid molecule 81 transfer from the graphene nanoribbon 80.

If a SAM containing COOH is used as the film 50A placed under the graphene nanoribbon 10A of the Schottky barrier diode 1A, electrons transfer from the part 11A the part 12A of the graphene nanoribbon 10A to the film 50A. As a result, the graphene nanoribbon 10A is doped (p-doped).

The Schottky barrier diode 1A having the above structure is formed by the same method as with the above first embodiment (FIGS. 3A through 9C). With the part 12A of the graphene nanoribbon 10A, however, the armchair type edges are terminated with $NH_2$.

That is to say, the part 11A of the graphene nanoribbon 10A in which the edges 10Ac are terminated with H is formed in accordance with FIGS. 3A through 3C and the like. In order to form the part 12A of the graphene nanoribbon 10A, an anthracene dimer or the like part of whose edges are terminated with $NH_2$ is used in place of the anthracene dimer 130 (FIG. 4A) or the like which is described in the above first embodiment and part of whose edges are terminated with F. Such a material is used and the example of FIGS. 4B and 4C or FIGS. 5A and 5B is followed. By doing so, the graphene nanoribbon 10A including the part 11A in which the edges 10Ac are terminated with H and the part 12A in which the edges 10Ac are terminated with $NH_2$ is formed. After that, the Schottky barrier diode 1A is formed in accordance with the examples of FIGS. 6A through 6C, FIGS. 7A through 7C, and FIGS. 8A through 8C or the examples of FIGS. 6A through 6C and FIGS. 9A through 9C.

The Schottky barrier diode 1A having the above structure will be described further.

Figure 17:
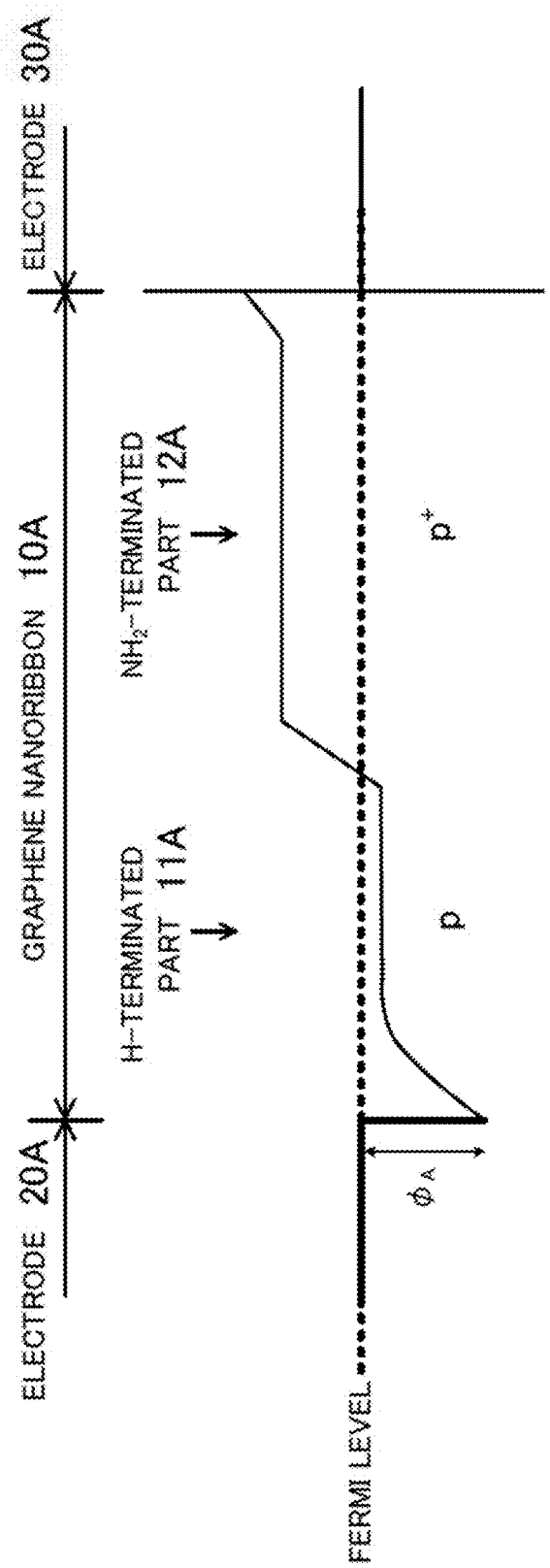
FIG. 17 is a schematic view of band alignment of the Schottky barrier diode according to the second embodiment.

FIG. 17 is a schematic view of band alignment of the Schottky barrier diode according to the second embodiment.

As stated above, the Schottky barrier diode 1A includes the graphene nanoribbon 10A placed between the electrode 20A and the electrode 30A over the electron-withdrawing film 50A. The graphene nanoribbon 10A has the part (H-terminated part) 11A on the electrode 20A side in which the edges 10Ac are terminated with H and the part ($NH_2$-terminated part) 12A on the electrode 30A side in which the edges 10Ac are terminated with $NH_2$.

As illustrated in FIG. 11, energy at the conduction band bottom, the Fermi level, and the valence band top of a graphene nanoribbon in which an armchair type edge in a length direction is terminated with H is lower than energy at the conduction band bottom, the Fermi level, and the valence band top, respectively, of a graphene nanoribbon in which an armchair type edge in a length direction is terminated with $NH_2$. With a graphene nanoribbon obtained by combining a graphene nanoribbon in which an armchair type edge in a length direction is terminated with H and a graphene nanoribbon in which an armchair type edge in a length direction is terminated with $NH_2$, the latter graphene nanoribbon forms a p-type ohmic connection with a specific metal electrode more easily than the former graphene nanoribbon.

With the Schottky barrier diode 1A (FIG. 15A and FIG. 15B), the graphene nanoribbon 10A has a structure in which the part 11A where the edges 10Ac are terminated with H and the part 12A where the edges 10Ac are terminated with $NH_2$ are combined. Furthermore, the part 11A and the part 12A of the graphene nanoribbon 10A are p-doped by the electron-withdrawing film 50A. In addition, the electrode 20A having a determined work function is connected to the end 10Aa of the part 11A of the graphene nanoribbon 10A where the edges 10Ac are terminated with H, and the electrode 30A having a determined work function is connected to the end 10Ab of the part 12A of the graphene nanoribbon 10A where the edges 10Ac are terminated with $NH_2$.

On the basis of a combination of the part 11A and the part 12A and connection between the graphene nanoribbon 10A and the electrodes 20A and 30A, the part 11A, the part 12A, the electrode 20A, and the electrode 30A are equal in Fermi level in a thermal equilibrium state. At this time there is a difference in electronic state between the part 11A and the part 12A of the graphene nanoribbon 10A. Accordingly, as illustrated in FIG. 17, the part 11A on the electrode 20A side where the edges 10Ac are terminated with H is of a p type and the part 12A on the electrode 30A side where the edges 10Ac are terminated with $NH_2$ is of a $p^+$ type. A Schottky barrier $\Phi_A$ is formed between the part 11A (of a p type) of the graphene nanoribbon 10A where the edges 10Ac are terminated with H and the electrode 20A, and there is a Schottky connection between them. On the other hand, there is an ohmic connection between the part 12A (of a $p^+$ type) of the graphene nanoribbon 10A where the edges 10Ac are terminated with $NH_2$ and the electrode 30A.

Figure 18:
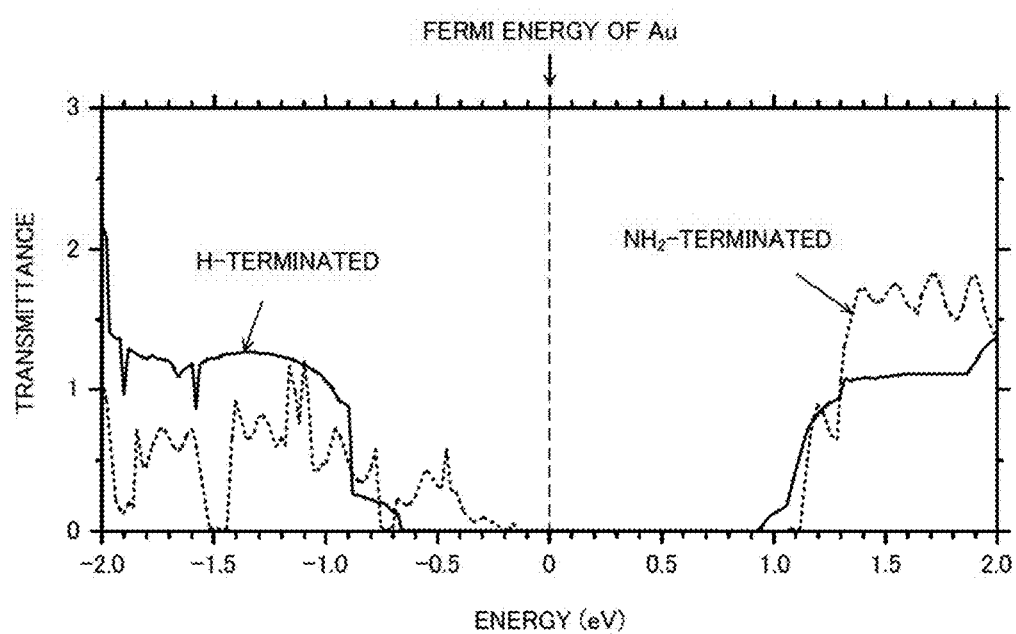
FIG. 18 illustrates a transmission spectrum of a graphene nanoribbon connected to an electrode in the second embodiment.
Figure 19:
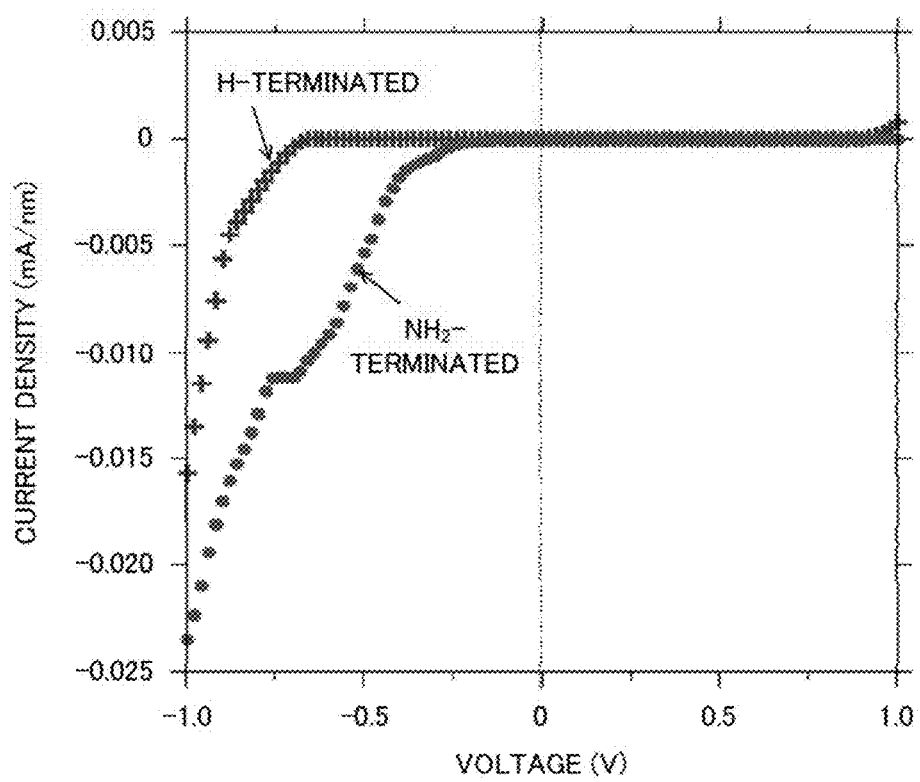
FIG. 19 illustrates the current-voltage characteristics of a graphene nanoribbon connected to an electrode in the second embodiment.

FIG. 18 illustrates a transmission spectrum of the graphene nanoribbon connected to an electrode in the second embodiment. FIG. 19 illustrates the current-voltage characteristics of the graphene nanoribbon connected to an electrode in the second embodiment.

FIG. 18 illustrates a transmission spectrum of a graphene nanoribbon in which an armchair type edge is terminated with H connected to an Au electrode and a transmission spectrum of a graphene nanoribbon in which an armchair type edge is terminated with $NH_2$ connected to an Au electrode. In FIG. 18, a transmission spectrum of a graphene nanoribbon in which an armchair type edge is terminated with H is indicated by a solid line and a transmission spectrum of a graphene nanoribbon in which an armchair type edge is terminated with $NH_2$ is indicated by a dotted line. Furthermore, FIG. 19 illustrates the current-voltage characteristics of a graphene nanoribbon in which an armchair type edge is terminated with H connected to an Au electrode and the current-voltage characteristics of a graphene nanoribbon in which an armchair type edge is terminated with $NH_2$ connected to an Au electrode. In FIG. 19, a horizontal axis indicates a voltage (V) and a vertical axis indicates current density (mA/nm). In each of FIGS. 18 and 19, the graphene nanoribbon is not p-doped.

As is seen from FIG. 18, the transmission spectrum of the graphene nanoribbon in which the armchair type edge is terminated with H and the transmission spectrum of the graphene nanoribbon in which the armchair type edge is terminated with $NH_2$ differ. On a side on which energy is lower than the Fermi energy (0 eV in FIG. 18) of Au, the transmittance of the graphene nanoribbon in which the armchair type edge is terminated with H is higher than that of the graphene nanoribbon in which the armchair type edge is terminated with $NH_2$. On a side on which energy is higher than the Fermi energy (0 eV in FIG. 18) of Au, the transmittance of the graphene nanoribbon in which the armchair type edge is terminated with $NH_2$ is higher than that of the graphene nanoribbon in which the armchair type edge is terminated with H.

As is seen from FIG. 19, with each of a graphene nanoribbon in which an armchair type edge is terminated with H and a graphene nanoribbon in which an armchair type edge is terminated with $NH_2$, a current begins to flow when a certain voltage is applied. A voltage (absolute value of a voltage) at which a current begins to flow through the graphene nanoribbon in which the armchair type edge is terminated with $NH_2$ is smaller than a voltage (absolute value of a voltage) at which a current begins to flow through the graphene nanoribbon in which the armchair type edge is terminated with H. If each of a graphene nanoribbon in which an armchair type edge is terminated with H and a graphene nanoribbon in which an armchair type edge is terminated with $NH_2$ is p-doped, a voltage at which a current begins to flow is small compared with FIG. 19.

It is understood that a current flows more easily through the graphene nanoribbon in which the armchair type edge is terminated with $NH_2$ than through the graphene nanoribbon in which the armchair type edge is terminated with H. That is to say, it is understood that the height of a barrier between Au and a graphene nanoribbon clearly changes according to the type of a modifying group.

In the second embodiment, the p-type Schottky barrier diode 1A having the graphene nanoribbon 10A including the part 11A in which the edges 10Ac in the length direction X are terminated with H and the part 12A in which the edges 10Ac in the length direction X are terminated with $NH_2$ is taken as an example. Furthermore, if the same band alignment as with the above H and $NH_2$ is realized, edges in a length direction of a graphene nanoribbon may be terminated with modifying groups of other atoms or molecules to realize a p-type Schottky barrier diode. For example, on the basis of the relationship between a modifying group of an edge and an electronic state of a graphene nanoribbon illustrated in FIG. 11, a side of a graphene nanoribbon on which a Schottky connection is formed may be terminated with H and a side of the graphene nanoribbon on which an ohmic connection is formed may be terminated with a methoxy group ($OCH_3$). By doing so, a p-type Schottky barrier diode which is similar to the above Schottky barrier diode 1A is realized. In addition, a side of the graphene nanoribbon on which an ohmic connection is formed may be terminated with an alkoxy group such as an ethoxy group ($OC_2H_5$). By doing so, a p-type Schottky barrier diode which is similar to the above Schottky barrier diode 1A is realized.

As has been described, in the second embodiment the graphene nanoribbon 10A including the part 11A and the part 12A which differ in electronic state is used for realizing a Schottky connection with the electrode 20A on the part 11A side and realizing an ohmic connection with the electrode 30A on the part 12A side. By doing so, a high performance p-type Schottky barrier diode 1A having good diode characteristics is realized.

A third embodiment will now be described.

As stated above, the electronic state of a graphene nanoribbon is changed by changing a modifying group of its edges in the length direction. In addition, the electronic state of a graphene nanoribbon is changed by changing its width.

Figure 20:
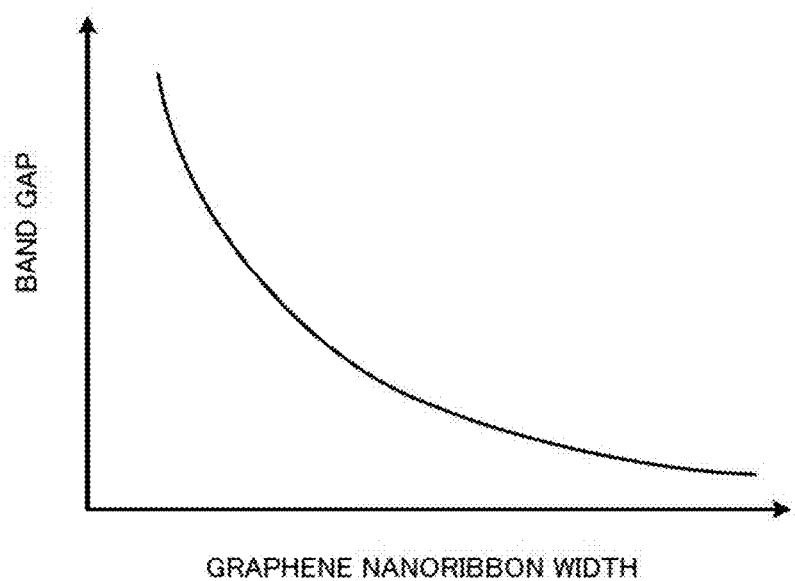
FIG. 20 illustrates the relationship between a width and a band gap of a graphene nanoribbon.

FIG. 20 illustrates the relationship between a width and a band gap of a graphene nanoribbon. FIG. 20 displays the following tendency. As the width of a graphene nanoribbon decreases, its band gap widens. By utilizing such a property, an n-type or p-type Schottky barrier diode may be formed.

Figure 21A:
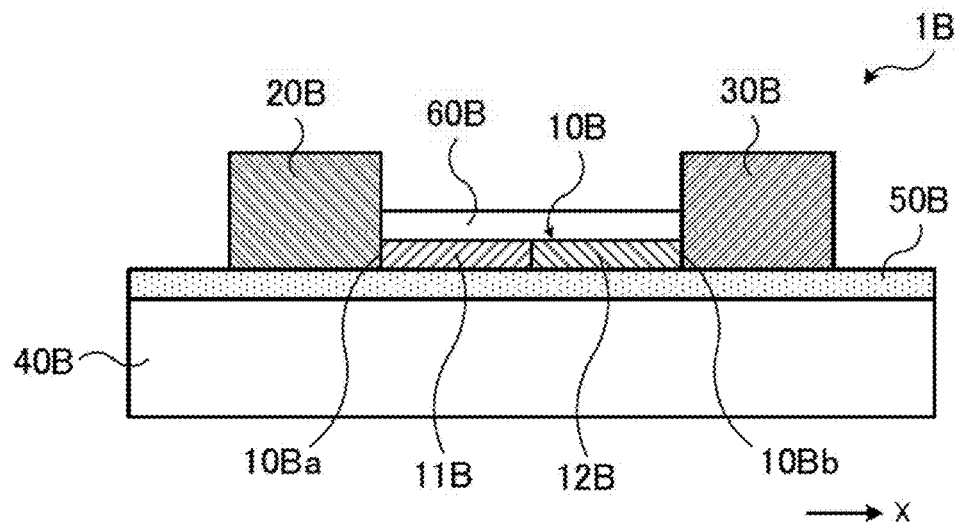
FIGS. 21A and 21B illustrate an example of a Schottky barrier diode according to a third embodiment.
Figure 21B:
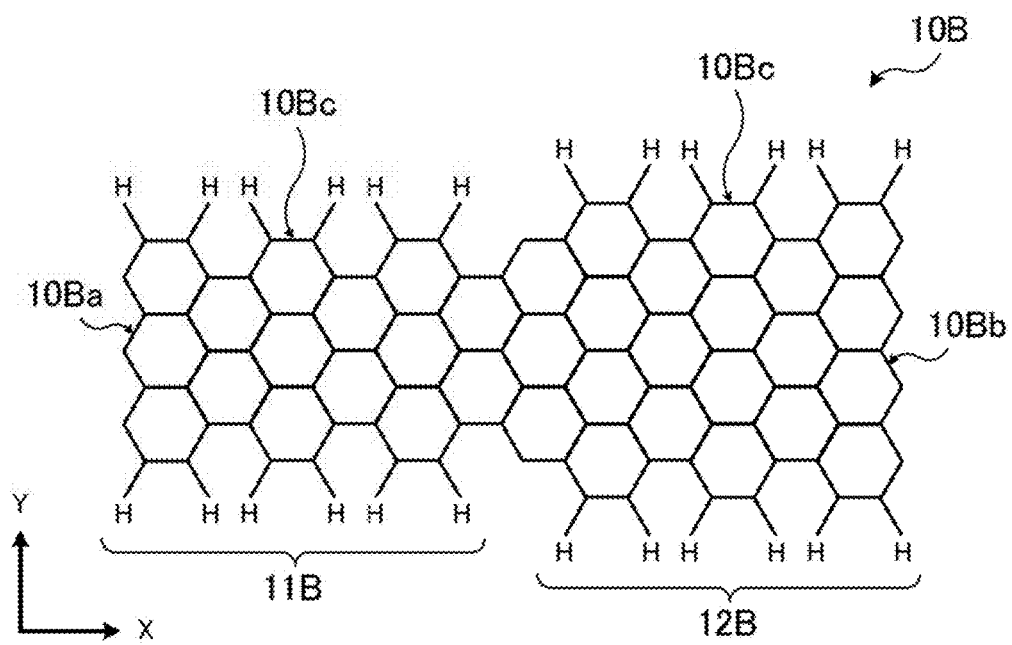

FIGS. 21A and 21B illustrate an example of a Schottky barrier diode according to a third embodiment. FIG. 21A is a fragmentary schematic sectional view of a Schottky barrier diode according to a third embodiment. FIG. 21B is a schematic view of an example of a graphene nanoribbon used in the Schottky barrier diode according to the third embodiment. Furthermore, FIGS. 22A and 22B are schematic views of band alignment of the Schottky barrier diode according to the third embodiment.

A Schottky barrier diode 1B illustrated in FIG. 21A includes a graphene nanoribbon 10B, an electrode 20B connected to one end 10Ba of the graphene nanoribbon 10B, and an electrode 30B connected to the other end 10Bb of the graphene nanoribbon 10B. For example, the graphene nanoribbon 10B is connected to the electrode 20B only at the end 10Ba and is connected to the electrode 30B only at the end 10Bb. The graphene nanoribbon 10B, the electrode 20B, and the electrode 30B are placed over a determined film 50B formed over a support substrate 40B such as a sapphire substrate. The electrode 20B and the electrode 30B may be placed directly over the support substrate 40B without placing the film 50B therebetween. A passivation film 60B made of h-BN or the like is placed over the graphene nanoribbon 10B.

As illustrated in FIG. 21B, a graphene nanoribbon including a part 11B having a width corresponding to three six-membered rings and a part 12B having a width corresponding to four six-membered rings is taken as an example of the graphene nanoribbon 10B. In this example, an end 10Ba and an end 10Bb of the part 11B and the part 12B, respectively, of the graphene nanoribbon 10B are zigzag type ends. Edges 10Bc in a length direction X of the part 11B and the part 12B of the graphene nanoribbon 10B are armchair type edges. The edges 10Bc in the length direction X are terminated with H. The carbon number of the zigzag type end 10Ba of the part 11B is 7 and the carbon number of the zigzag type end 10Bb of the part 12B is 9. The part 11B and the part 12B of the graphene nanoribbon 10B which differ in width have different electronic states. The band gap of the part 11B is about 1.6 eV and the band gap of the part 12B is about 0.7 eV.

Figure 22A:
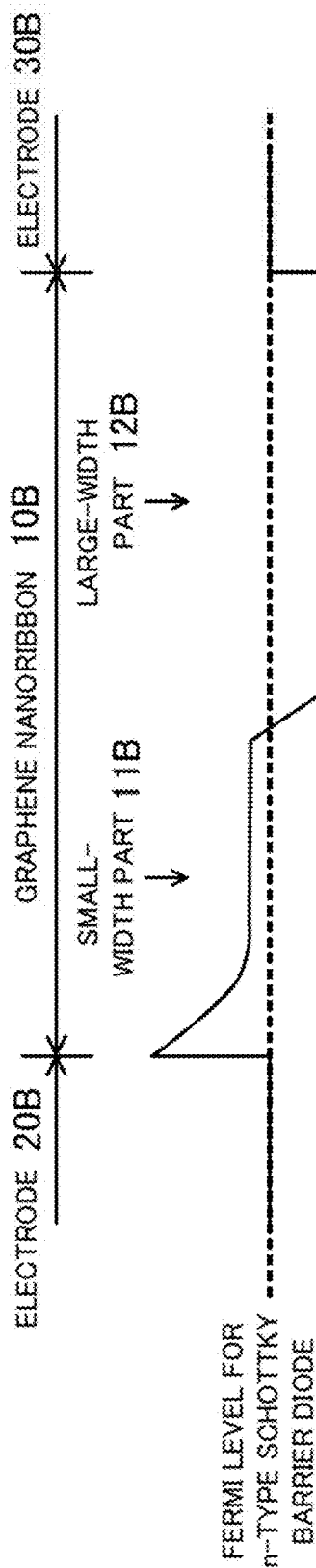
FIGS. 22A and 22B are schematic views of band alignment of the Schottky barrier diode according to the third embodiment.
Figure 22B:
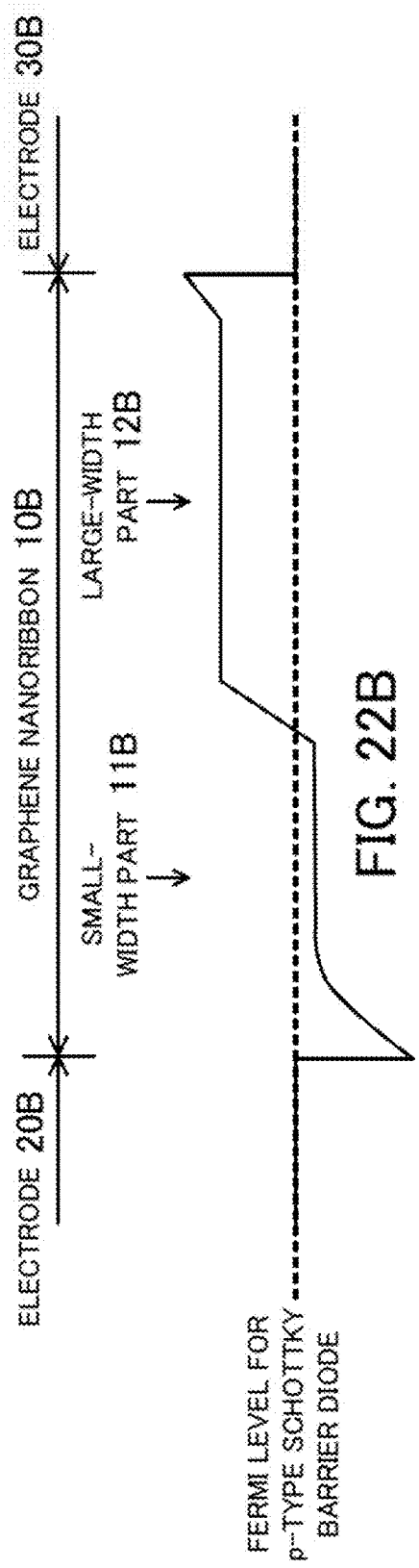

An n-type Schottky barrier diode 1B indicative of the band alignment illustrated in, for example, FIG. 22A is realized by the use of the graphene nanoribbon 10B including the part (small-width part) 11B and the part (large-width part) 12B which differ in width. Alternatively, a p-type Schottky barrier diode 1B indicative of the band alignment illustrated in, for example, FIG. 22B is realized by the use of the graphene nanoribbon 10B including the part (small-width part) 11B and the part (large-width part) 12B which differ in width.

On the basis of the difference in electronic state between the part 11B and the part 12B of the graphene nanoribbon 10B and materials (their work functions) for the electrodes 20B and 30B, the part 11B forms a Schottky connection with the electrode 20B and the part 12B forms an ohmic connection with the electrode 30B. A p-type or n-type Schottky barrier diode 1B is realized by properly selecting the electrode 20B and the electrode 30B, properly selecting a modifying group of the edges 10Bc, and properly performing doping with the film 50B.

For example, in order to realize an n-type Schottky barrier diode 1B, the following materials are selected in accordance with the example described in the above first embodiment. That is to say, the edges 10Bc of the graphene nanoribbon 10B are terminated with H. Cr/Au or Ti/Au are used as the electrode 20B on the side of the part 11B of the graphene nanoribbon 10B on which a Schottky connection is formed. Ti/Au are used as the electrode 30B on the side of the part 12B of the graphene nanoribbon 10B on which an ohmic connection is formed. An electron-donating film, such as $N(CH_3)_2$-SAM, is used as the film 50B under the graphene nanoribbon 10B. These materials are used for realizing an n-type Schottky barrier diode 1B indicative of the band alignment illustrated in FIG. 22A.

Furthermore, in order to realize a p-type Schottky barrier diode 1B, the following materials are selected in accordance with the example described in the above second embodiment. That is to say, the edges 10Bc of the graphene nanoribbon 10B are terminated with H. Au is used as the electrode 20B on the side of the part 11B of the graphene nanoribbon 10B on which a Schottky connection is formed. Pt is used as the electrode 30B on the side of the part 12B of the graphene nanoribbon 10B on which an ohmic connection is formed. An electron-withdrawing film, such as HOOC-SAM, is used as the film 50B under the graphene nanoribbon 10B. These materials are used for realizing a p-type Schottky barrier diode 1B indicative of the band alignment illustrated in FIG. 22B.

The graphene nanoribbon 10B including the part 11B and the part 12B which differ in width is formed in accordance with the examples described in the above first embodiment (FIGS. 3A through 9C). That is to say, in accordance with the example of FIGS. 3A through 5B, the part 11B whose edges are terminated with H and which has a width corresponding to three six-membered rings is formed with an anthracene dimer as a precursor and the part 12B whose edges are terminated with H and which has a width corresponding to four six-membered rings is formed with a tetracene dimer as a precursor. After that, the Schottky barrier diode 1B is formed in accordance with the examples of FIGS. 6A through 6C, FIGS. 7A through 7C, and FIGS. 8A through 8C or the examples of FIGS. 6A through 6C and FIGS. 9A through 9C.

The Schottky barrier diode 1B using the graphene nanoribbon 10B in which the edges 10Bc of the part 11B and the part 12B are terminated with H is taken as an example. However, edges may be terminated with a modifying group of another atom or molecule to adjust band alignment.

As has been described, in the third embodiment the graphene nanoribbon 10B including the part 11B and the part 12B which differ in electronic state because of a difference in width is used for realizing a Schottky connection with the electrode 20B on the part 11B side and realizing an ohmic connection with the electrode 30B on the part 12B side. By doing so, a high performance n-type or p-type Schottky barrier diode 1B having good diode characteristics is realized.

A fourth embodiment will now be described.

Figure 23A:
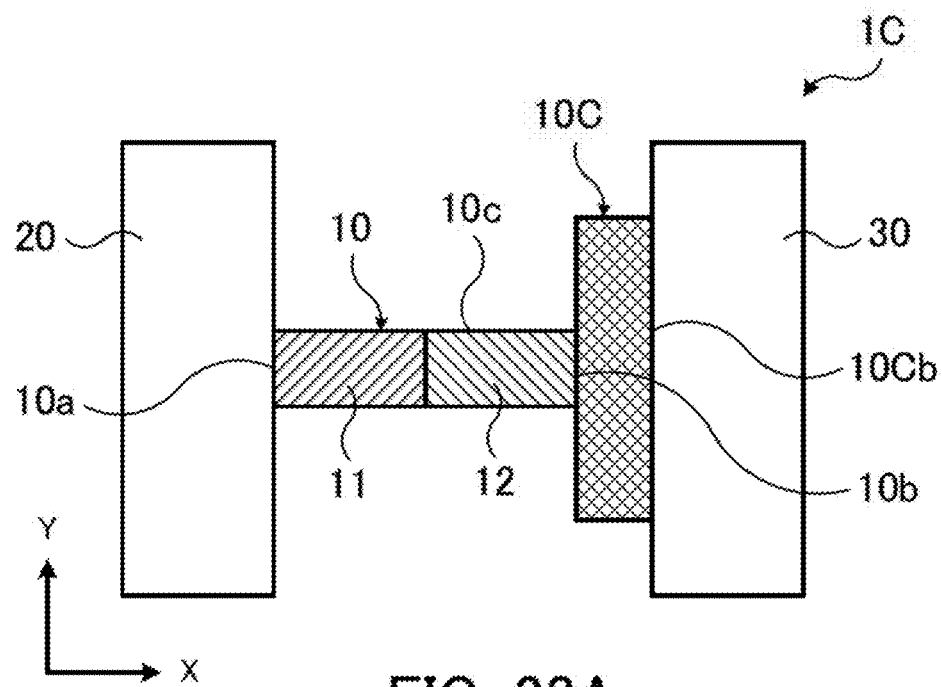
FIGS. 23A and 23B illustrate an example of a Schottky barrier diode according to a fourth embodiment.
Figure 23B:
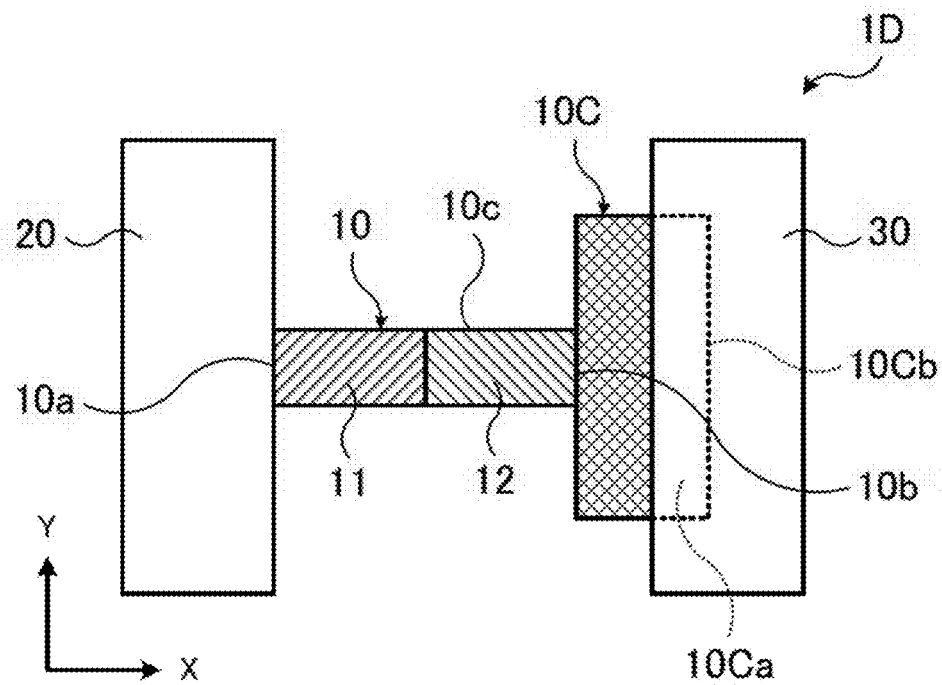

FIGS. 23A and 23B illustrate examples of a Schottky barrier diode according to a fourth embodiment. Each of FIGS. 23A and 23B is a fragmentary schematic plan view of an example of a Schottky barrier diode.

A Schottky barrier diode 1C illustrated in FIG. 23A has the following structure. A graphene nanoribbon 10 includes a part 11 whose edges 10*c* in a length direction X are terminated with H and a part 12 whose edges 10*c* in the length direction X are terminated with F. A graphene 10C is inserted between the part 12 and an electrode 30. An end 10*a* of the graphene nanoribbon 10 is connected to an electrode 20, an end 10*b* of the graphene nanoribbon 10 is connected (bonded) to the graphene 10C, and an end 10Cb of the graphene 10C is connected to the electrode 30. The Schottky barrier diode 1C illustrated in FIG. 23A differs from the Schottky barrier diode 1 described in the above first embodiment in these respects.

The graphene nanoribbon 10, the graphene 10C, the electrode 20, and the electrode 30 are placed over a determined film formed over a support substrate such as a sapphire substrate. The electrode 20 and the electrode 30 may be placed directly over the support substrate without placing the film therebetween. A passivation film made of h-BN or the like is placed over the graphene nanoribbon 10 and the graphene 10C.

With the Schottky barrier diode 1C the part 11 whose edges 10*c* are terminated with H forms a Schottky connection with the electrode 20. The part 12 whose edges 10*c* are terminated with F is bonded to the graphene 10C and the graphene 10C forms an ohmic connection with the electrode 30. The graphene 10C has no band gap. Therefore, the graphene 10C easily forms an ohmic connection with the electrode 30.

Furthermore, with a Schottky barrier diode 1D illustrated in FIG. 23B, an end portion 10Ca of a graphene 10C is covered with an electrode 30 and an end 10Cb of the graphene 10C is situated under the electrode 30. The Schottky barrier diode 1D differs from the Schottky barrier diode 1C illustrated in FIG. 23A in this respect. The graphene 10C has no band gap. Therefore, even if the graphene 10C is connected to the electrode 30 so that the end portion 10Ca will be covered with the electrode 30, deterioration in the diode characteristics of the Schottky barrier diode 1D is suppressed.

As has been described, in addition to the graphene nanoribbon 10 including the part 11 whose edges 10c are terminated with H and the part 12 whose edges 10c are terminated with F, the graphene 10C connected to the part 12 may be used for obtaining the Schottky barrier diode 1C or 1D.

Furthermore, the following structure may be adopted for realizing an ohmic connection. A graphene is placed over a part 12 (its end portion, for example) of a graphene nanoribbon 10 whose edges are terminated with F, and an electrode 30 is placed over the graphene.

In the above examples, the edges of the part 11 on a side on which a Schottky connection with the electrode 20 is formed are terminated with H and the edges of the part 12 on the graphene 10C side on which an ohmic connection with the electrode 30 is formed are terminated with F. Furthermore, in accordance with the example described in the above first or second embodiment, various n-type or p-type Schottky barrier diodes are realized by properly selecting the electrode 20 and the electrode 30, properly selecting a modifying group of the edges 10c, and properly performing doping with the foundation film. In addition, in accordance with the example described in the above third embodiment, the part 11 on a side on which a Schottky connection with the electrode 20 is formed and the part 12 on the graphene 10C side on which an ohmic connection with the electrode 30 is formed may be made to differ in width to realize various n-type or p-type Schottky barrier diodes.

A fifth embodiment will now be described.

The Schottky barrier diodes 1, 1A, 1B, 1C, 1D, and so on described in the above first through fourth embodiments may be mounted in detectors and various electronic apparatus using detectors.

Figure 24:
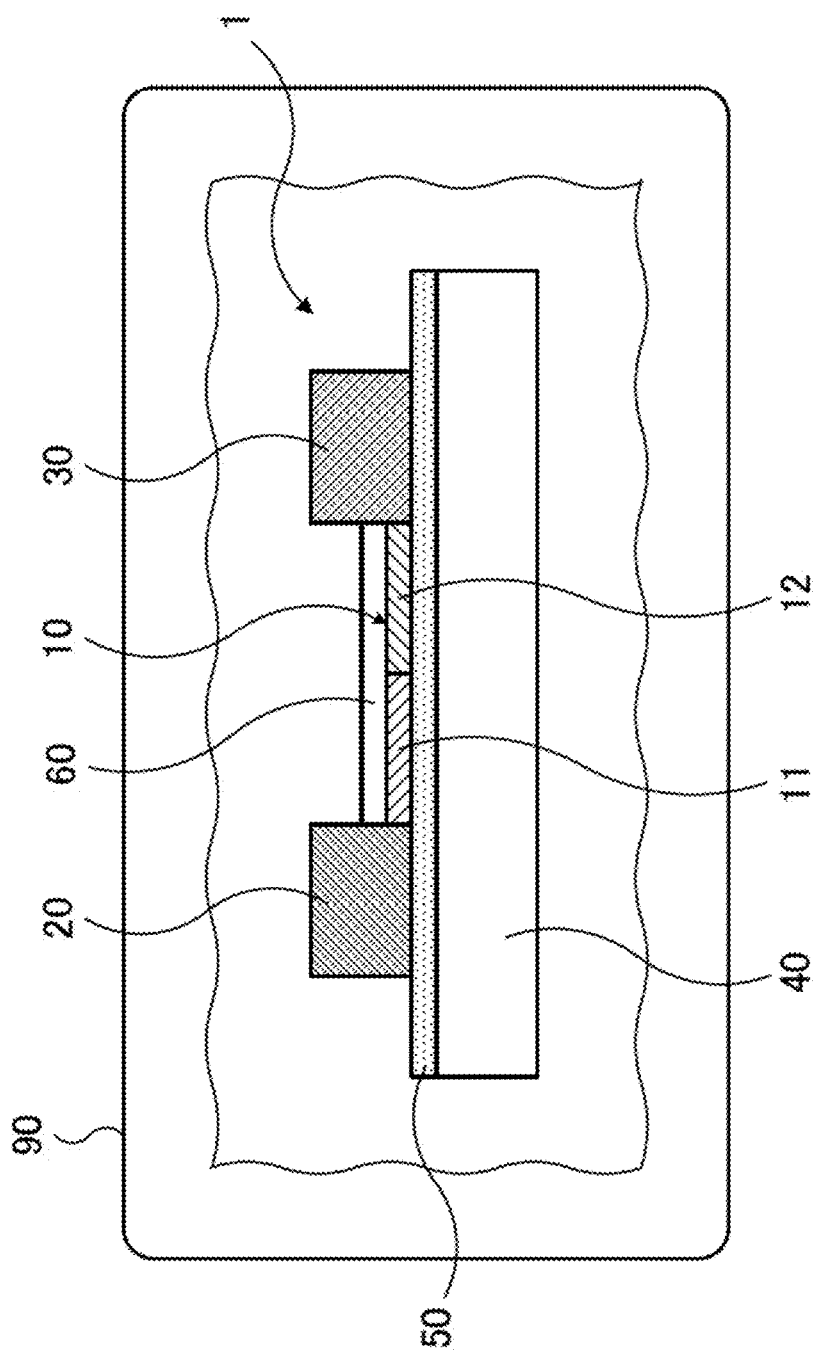
FIG. 24 illustrates an example of an electronic apparatus according to a fifth embodiment.

FIG. 24 illustrates an example of an electronic apparatus according to a fifth embodiment. FIG. 24 is a schematic view of an example of an electronic apparatus.

As illustrated in FIG. 24, the Schottky barrier diode 1 described in the above first embodiment, for example, is mounted (incorporated) in an electronic apparatus 90 such as a detector. As stated above, with the Schottky barrier diode 1 using the graphene nanoribbon 10, good diode characteristics are obtained. A high performance electronic apparatus 90 in which a high performance Schottky barrier diode 1 is mounted is realized.

In this case, the Schottky barrier diode 1 described in the above first embodiment is taken as an example. However, the other Schottky barrier diodes 1A, 1B, 1C, 1D, and so on may be mounted in the same way in various electronic apparatus.

In the above descriptions the following example is taken. A graphene nanoribbon includes two parts. One part forms a Schottky connection with an electrode and the other part forms an ohmic connection with an electrode. The two parts differ in electronic state. Furthermore, the following structure may be adopted. A graphene nanoribbon includes three or more parts combined in the length direction. A Schottky connection is formed on one end side and an ohmic connection is formed on the other end side. These parts differ in electronic state because of a difference in the type of a modifying group or width.

According to the disclosed technique, a high performance Schottky barrier diode using a graphene nanoribbon is realized. Furthermore, a high performance electronic apparatus including such a Schottky barrier diode is realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A Schottky barrier diode comprising:
 a substrate;
 a graphene nanoribbon placed over the substrate; and
 a first electrode and a second electrode placed over the substrate, and respectively including a first metal element and a second metal element and respectively connected to a first end and a second end opposing in a length direction of the graphene nanoribbon,
 wherein the graphene nanoribbon includes:
  a first part including the first end and having a first electronic state; and
  a second part including the second end and having a second electronic state different from the first electronic state,
 wherein the first end of the first part is connected to a first side surface of the first electrode, and
 wherein the second end of the second part is connected to a second side surface of the second electrode.

2. The Schottky barrier diode according to claim 1, wherein edges opposing in a width direction of the graphene nanoribbon are armchair type edges.

3. The Schottky barrier diode according to claim 1, wherein the first part and the second part of the graphene nanoribbon differ before connection in energy level at a conduction band bottom, a valence band top, and a Fermi level.

4. The Schottky barrier diode according to claim 1, wherein:
 edges of the first part opposing in a width direction of the graphene nanoribbon are terminated with a first modifying group; and
 edges of the second part opposing in the width direction of the graphene nanoribbon are terminated with a second modifying group different from the first modifying group.

5. The Schottky barrier diode according to claim 1, wherein:
 the first part has a first width between edges of the first part opposing in a width direction of the graphene nanoribbon; and the second part has a second width different from the first width between edges of the second part opposing in the width direction of the graphene nanoribbon.

6. The Schottky barrier diode according to claim 1, wherein the graphene nanoribbon is placed over a film placed over the substrate and having a function of doping the graphene nanoribbon.

7. The Schottky barrier diode according to claim 6, wherein the film contains an electron-donating group.

8. The Schottky barrier diode according to claim 6, wherein the film contains an electron-withdrawing group.

9. The Schottky barrier diode according to claim 1, wherein:
one of the first electrode and the second electrode forms a Schottky connection with the graphene nanoribbon; and
another of the first electrode and the second electrode forms an ohmic connection with the graphene nanoribbon.

10. The Schottky barrier diode according to claim 1, wherein a graphene is inserted between one of the first electrode or the second electrode and the graphene nanoribbon.

11. A Schottky barrier diode fabrication method comprising:
forming a graphene nanoribbon over a substrate; and
forming a first electrode and a second electrode respectively including a first metal element and a second metal element and respectively connected to a first end and a second end opposing in a length direction of the graphene nanoribbon,
wherein the forming of the graphene nanoribbon includes:
forming a first part including the first end and having a first electronic state; and
forming a second part including the second end and having a second electronic state different from the first electronic state,
wherein the first end of the first part is connected to a first side surface of the first electrode, and
wherein the second end of the second part is connected to a second side surface of the second electrode.

12. The Schottky barrier diode fabrication method according to claim 11, wherein the forming of the first electrode and the second electrode includes:
forming a first mask having a first opening portion in which a first end portion of the graphene nanoribbon is exposed;
removing the first end portion in the first opening portion by use of the first mask;
forming a material for the first electrode in the first opening portion in which the first end portion is removed;
forming a second mask having a second opening portion in which a second end portion of the graphene nanoribbon is exposed;
removing the second end portion in the second opening portion by use of the second mask; and
forming a material for the second electrode in the second opening portion in which the second end portion is removed.

13. The Schottky barrier diode fabrication method according to claim 11, wherein the graphene nanoribbon is formed over a film placed over the substrate and having a function of doping the graphene nanoribbon.

14. An electronic apparatus comprising a Schottky barrier diode, wherein the Schottky barrier diode includes:
a substrate;
a graphene nanoribbon placed over the substrate; and
a first electrode and a second electrode placed over the substrate, and respectively including a first metal element and a second metal element and respectively connected to a first end and a second end opposing in a length direction of the graphene nanoribbon,
the graphene nanoribbon including:
a first part including the first end and having a first electronic state; and
a second part including the second end and having a second electronic state different from the first electronic state,
wherein the first end of the first part is connected to a first side surface of the first electrode, and
wherein the second end of the second part is connected to a second side surface of the second electrode.

15. The Schottky barrier diode according to claim 1, wherein:
the first electrode forms a Schottky connection with the first part; and
the second electrode forms an ohmic connection with the second part.

16. The Schottky barrier diode according to claim 15, wherein a graphene having a wider width than a width between edges opposing in a width direction of the graphene nanoribbon is placed between the second electrode and the second end.

* * * * *